United States Patent
Hidaka

(10) Patent No.: US 7,355,455 B2
(45) Date of Patent: Apr. 8, 2008

(54) LOW POWER CONSUMPTION MIS SEMICONDUCTOR DEVICE

(75) Inventor: Hideto Hidaka, Hyogo (JP)

(73) Assignee: Renesas Technology Corp., Chiyoda-Ku, Tokyo (JP)

(*) Notice: Subject to any disclaimer, the term of this patent is extended or adjusted under 35 U.S.C. 154(b) by 5 days.

(21) Appl. No.: 11/369,852

(22) Filed: Mar. 8, 2006

(65) Prior Publication Data

US 2006/0145726 A1 Jul. 6, 2006

Related U.S. Application Data

(62) Division of application No. 10/409,585, filed on Apr. 9, 2003, now Pat. No. 7,042,245.

(30) Foreign Application Priority Data

Oct. 25, 2002 (JP) .............................. 2002-311029

(51) Int. Cl.
*H03K 19/20* (2006.01)
*G05F 1/10* (2006.01)

(52) U.S. Cl. .................... 326/121; 326/95; 326/33; 327/546

(58) Field of Classification Search ................ 326/121, 326/83, 17, 33, 81, 95, 98; 327/544, 546
See application file for complete search history.

(56) References Cited

U.S. PATENT DOCUMENTS

| | | | |
|---|---|---|---|
| 3,427,445 A | 2/1969 | Dailey | |
| 3,492,549 A | 1/1970 | Janning | |
| 3,509,375 A | 4/1970 | Gormley | |
| 3,956,714 A | 5/1976 | Luscher | |
| 3,962,686 A | 6/1976 | Matsue et al. | |
| 3,986,044 A | 10/1976 | Madland et al. | |
| 4,057,821 A | 11/1977 | Patel | |
| 4,063,267 A | 12/1977 | Hsia | |
| 4,124,806 A | 11/1978 | Rusznyak | |
| 4,330,722 A | 5/1982 | Sampson, III | |
| 4,357,685 A | 11/1982 | Daniele et al. | |
| 4,481,521 A | 11/1984 | Okumura | |
| 4,484,087 A | 11/1984 | Mazin et al. | |
| 4,611,220 A | 9/1986 | MacIver | |
| 4,665,423 A | 5/1987 | Akiya | |

(Continued)

FOREIGN PATENT DOCUMENTS

JP 06-029834 A 2/1994

(Continued)

*Primary Examiner*—Daniel Chang
(74) *Attorney, Agent, or Firm*—Buchanan Ingersoll & Rooney PC

(57) ABSTRACT

A logic gate is constructed of an insulated gate field effect transistor (MIS transistor) having a thin gate insulation film. An operation power supply line to the logic gate is provided with an MIS transistor having a thick gate insulation film for switching the supply and stop of an operation power source voltage. A voltage of the gate of the power source switching transistor is made changing in an amplitude greater than an amplitude of an input and an output signal to the logic gate. Current consumption in a semiconductor device configured of MIS transistor of a thin gate insulation film can be reduced and an power source voltage thereof can be stabilized.

7 Claims, 19 Drawing Sheets

U.S. PATENT DOCUMENTS

| | | |
|---|---|---|
| 4,952,825 A | 8/1990 | Yoshida |
| 5,466,952 A | 11/1995 | Moody |
| 5,495,122 A | 2/1996 | Tada |
| 5,583,457 A * | 12/1996 | Horiguchi et al. .......... 326/121 |
| 5,963,803 A | 10/1999 | Dawson et al. |
| 5,998,974 A | 12/1999 | Sudo et al. |
| 6,307,234 B1 | 10/2001 | Ito et al. |
| 6,351,174 B2 | 2/2002 | Soltero et al. |
| 6,384,674 B2 * | 5/2002 | Tanizaki et al. ............ 327/544 |
| 6,556,074 B2 | 4/2003 | Suzuki |
| 6,611,031 B2 | 8/2003 | Nakamura |
| 6,628,554 B2 | 9/2003 | Hidaka |
| 6,798,682 B2 | 9/2004 | Chuang et al. |
| 2002/0008999 A1 | 1/2002 | Hidaka |

FOREIGN PATENT DOCUMENTS

| | | |
|---|---|---|
| JP | 08-227580 | 9/1996 |
| JP | 09-116417 | 5/1997 |
| JP | 09-116417 A | 5/1997 |
| JP | 10-145215 | 5/1998 |
| JP | 10-242840 | 9/1998 |
| JP | 11-150193 | 6/1999 |
| JP | 11-150193 A | 6/1999 |
| JP | 2000-165224 | 6/2000 |
| JP | 2000-243851 | 9/2000 |
| JP | 2002-064150 | 2/2002 |
| JP | 2002-111470 | 4/2002 |

* cited by examiner

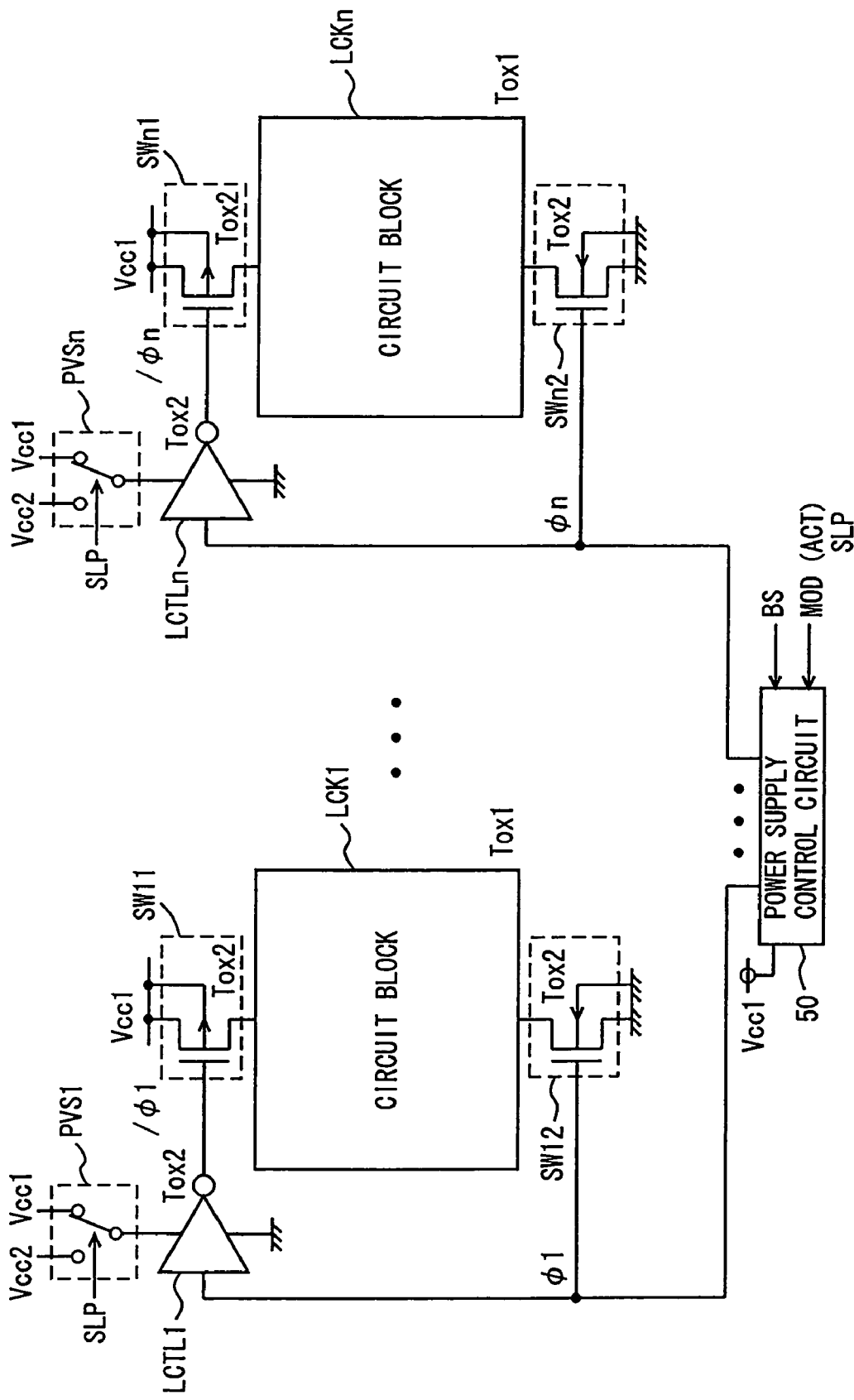
F I G. 21

LOW POWER CONSUMPTION MIS SEMICONDUCTOR DEVICE

CROSS REFERENCES AND RELATED APPLICATIONS

This application is a Divisional of U.S. patent application Ser. No. 10/409,585 filed on Apr. 9, 2003 now U.S. Pat. No. 7,042,245.

BACKGROUND OF THE INVENTION

1. Field of the Invention

The present invention relates generally to semiconductor devices including an insulated gate field effect transistor (hereinafter referred to as an MIS transistor) and particularly to configurations for reducing power consumption in semiconductor devices having microfabricated CMOS transistors (p and n channel MIS transistors). More specifically, the present invention relates to configurations for reducing gate tunneling current of microfabricated MIS transistors.

2. Description of the Background Art

In CMOS semiconductor devices including CMOS transistors as a component, if an MIS transistor is significantly scaled down in size, an operating power supply voltage is reduced in order to ensure the reliability of the transistors and to achieve reduced power consumption. When the size of MIS transistor is reduced in accordance with the reduction of the operating power supply voltage, each parameter value of the transistors is reduced in accordance with a predetermined scaling rule.

According to such scaling rule, the MIS transistor is required to have a gate insulation film reduced in thickness, Tox, and a threshold voltage, Vth, reduced in absolute value. However, a threshold voltage cannot be reduced in absolute value in accordance with the scaling rule. The threshold voltage is defined as a gate to source voltage causing a prescribed drain current under application of a predetermined drain voltage.

When the threshold voltage Vth is reduced in absolute value and if a gate to source voltage Vgs attains 0V, a weak inversion layer is formed in a channel region and through this inversion layer a subthreshold current (hereinafter referred to as an "off-leak current") flows. The off-leak current increases as the threshold voltage decreases in absolute value. Accordingly, in a standby cycle in which MIS transistor is kept off, the off-leak current increases and a standby current increases disadvantageously. In particular, for portable equipment or other battery-driven equipment employing such a semiconductor device, reducing the off-leak current is a significant issue to increase the lifetime of a battery.

When the off-leak current is reduced by increasing the threshold voltage Vth in absolute value, an advantage achieved by reduced operating power supply voltage cannot be insured, and high speed operation cannot be ensured. A multi-threshold CMOS (MT-CMOS) configuration has been proposed, for example in Japanese Patent Laying-Open No. 6-29834, to reduce an off-leak current in the standby cycle and also ensure high speed operation.

In the MT-CMOS configuration proposed in the prior art document, a transistor having a threshold voltage M-Vth with a relatively large (intermediate) absolute value is connected between a main power supply line and a sub power supply line as a power supply switching transistor. A logic circuit is constructed of L-Vth transistors each having a threshold voltage with a small absolute value. In such logic circuit, a transistor kept off in the standby cycle is connected to the sub power supply line and a transistor kept conductive in the standby state is connected to the main power supply line.

In the standby cycle, the power supply switching transistor is kept in the off state. In the standby cycle, the voltage level of the sub power supply line is set to be a voltage level making the off-leak current of the power supply switching transistor balancing that of the transistors of the logic circuit. Therefore, due to the voltage drop at the power supply switching transistor, the transistor connected to the sub power supply line of the logic circuit has a gate to source voltage reversely biased to enter a more stronger off state. Thus, the off-leak current is further reduced, in conjunction with the small off-leak current of the power supply switch transistor.

In an active cycle, in which an operation is actually performed, the power supply switching transistors is set to the on state, the sub power supply line is connected to the main power supply line. Thus, the logic circuit, constructed of transistors having a threshold voltage with a small absolute value, operates at high speed.

Japanese Patent Laying-Open No. 9-116417 discloses that in order to set the power switching transistors to a stronger off state in the MT-CMOS configuration, a high voltage VPP higher than an H level power source voltage VDD is applied to a power switching transistor provided to the power supply voltage VDD, and a negative voltage VBB is applied to a power switching transistor provided for an L level power source voltage VSS.

Various parameters of an MIS transistor, such as feature size, are scaled down in accordance with a scaling rule. Such scaling rule stands on the premise that the gate length and the thickness of the gate insulation film of the MIS transistor are scaled down in accordance with a common shrinking rate. For example, an MIS transistor having a gate length of 0.25 μm has a gate insulation film generally having a thickness of 5 nm. Accordingly, an MIS transistor having a gate length of the order of 0.1 μm has a gate insulation film having a thickness of the range of 2.0 to 2.5 nm.

If a gate insulation film is reduced in thickness as an operating power supply voltage is reduced, e.g., the gate insulation film is reduced to substantially 3 nm under the condition of a power supply voltage of no more than 1.5V, a tunneling current flows through the gate insulation film of the MIS transistor in the on state (conductive state) and a power source current through the transistor in the on state increases disadvantageously.

Japanese Patent Laying-Open No. 11-150193 discloses that such a gate tunneling leak current might be reduced by a control circuit constructed of an MIS transistor of a thick gate insulation film and controlling turning on/off of the power switching transistor.

FIGS. 30A to 30C schematically show an energy band of an MIS structure. FIGS. 30A to 30C show, as an exemplary energy band, a band for a structure with a gate formed of a metal. Typically, in an MIS structure, a gate is formed of polysilicon doped with an impurity and has a property of semiconductor. However, to simplify the description, the gate is assumed to be formed of metal. In addition, the semiconductor substrate region is a p type substrate.

As shown in FIG. 30A, if the gate receives a negative voltage V, holes present in the p type substrate are attracted to an interface with the insulation film and the energy band of the p type substrate bends, at the interface between the insulation film and the p substrate, upward and a valence band Ev approaches a Fermi level EF. Furthermore, a conduction band Ec also bends upward in a vicinity of this interface.

When the negative voltage is applied, the Fermi level EF of the gate (corresponding to conduction band Ec for a polysilicon gate) also increases. In this condition, in the p type substrate, the density of majority carriers (holes) is increased at the interface, as compared with an inside thereof, and such state is referred to as an accumulated state. In this state, the conduction band Ec bends upward and a barrier against electrons is increased in height, and no current tunnels through the gate insulation film.

As shown in FIG. 30B, when the gate receives a low positive voltage V, the Fermi level EF (valence band Ec) of the gate decreases and responsively the p type substrate region also has the conduction band Ec and the valence band Ev banding downward at its interface with the insulation film. Holes are moved away from the interface with the insulation film, to cause the poor state of majority carriers (holes). Fermi level EF at the interface is positioned substantially at the center of a forbidden band and no majority carrier is present, and such a state is referred to as a "depletion state." In the depletion state, no carrier is present at an interface and, similarly, a tunneling current is not generated.

As shown in FIG. 30C, when the gate receives a larger positive voltage V, the Fermi level EF at the gate is further reduced and in the p type substrate, the band bending further increased in a vicinity of the interface. Consequently, in the vicinity of the interface of the p type substrate, Fermi level EF is increased to be higher than an intermediate value Eg/2 of an energy gap Eg and minority carriers, or electrons, are stored. Since the interface is opposite in conductivity to an inside, this state is referred to as an "inverted state."

This inverted state corresponds to a state of a channel being formed in an MIS transistor, and if the gate insulation film has a thickness δ, for example, of 3 nm, the minority carriers, or electrons, cause the tunneling phenomenon and flows to the gate. In other words, in an MIS transistor with a channel being formed, i.e., an MIS transistor in the on state, a tunneling current flows from a channel region to the gate directly. This tunneling current is referred to as a (direct) gate tunnel current.

This issue of disadvantageous gate tunnel current similarly applied to an n type substrate region, with the modification that the gate receives a voltage opposite in polarity and the energy band bends in the opposite directions.

As described above, if an MIS transistor has a gate insulation film reduced in thickness to 3 nm, for example, a gate tunnel current directly flows from the channel region to the gate. This gate tunnel current becomes the same in magnitude as an off-leak current when the gate insulation film has a thickness of the order of 3 nm. When the gate insulation film is reduced in thickness below 3 nm, the gate tunnel current increases to be greater in magnitude than the off-leak current. Thus, if an operating power supply voltage is decreased and a gate insulation film is reduced in thickness in accordance with a scaling rule, this gate tunnel current attains an insignificant, significant value and accordingly, a current consumed in the standby cycle increases.

A gate tunnel current J satisfies a relationship approximately represented by the following expression:

$$J \sim E \cdot \exp[-Tox \cdot A \cdot \sqrt{\phi}],$$

where φ represents a height of a barrier of an interface of the gate insulation film and approximately represented by a difference between a surface potential φs of the interface and Fermi level, A represents a constant determined by a concentration of an impurity (an effective mass of an electron) of a semiconductor substrate of a channel region, and E represents an electric field applied across the gate insulation film.

The barrier height φ is a function of a dielectric constant ∈i of the gate insulation film and thickness Tox of the gate insulation film. For example, if silicon oxide film is used to form the gate insulation film and the tunnel current flows at the thickness of 3 nm, such a gate tunnel current is also caused to flow in a gate insulation film providing the same barrier height as the silicon oxide film of 3 nm thickness. The gate insulation film can be formed of silicon oxinitride film, other than silicon oxide film.

If such a microfabricated MIS transistor is included as a component, the gate tunnel current of MIS transistor attains to be same as or greater in amount than an off-leak current in the standby state and a current consumed in the standby cycle cannot be reduced.

FIG. 31 shows a configuration of the MT-CMOS circuit disclosed in Japanese Patent Laying-Open No. 11-150193. In FIG. 31, a logic circuit is constructed of CMOS inverters IVa and IVb cascaded in two stages, by way of example. CMOS inverters IVa and IVb each include a p channel MIS transistor QPT having a source connected to a sub power supply line SPL and an n channel MIS transistor QNT having a source connected commonly to a sub ground line SGL. MIS transistors QPT and QNT in inverters IVa and IVb are each made to have a gate insulation film less than 2.5 nm in thickness.

Sub power supply line SPL is connected to a main power supply line MPL via a power supply switching transistor PS, and sub ground line SGL is connected to a main ground line MGL via a power supply switching transistor NS. Power supply switching transistor NS has its gate receiving a switch control signal SWCT, and power supply switching transistor PS has its gate receiving switch control signal SWCT via a CMOS inverter CIV. CMOS inverter CIV includes p and n channel MIS transistors each having a gate insulation film set to be not smaller than 4 nm in thickness. CMOS inverter CIV receives a power supply voltage VCC on main power supply line MPL and a ground voltage on main ground line MGL as operating power supply voltages. In other words, in CMOS inverter CIV, the p channel MIS transistor has its source connected to main power supply line MPL, and the channel MIS transistor has its source connected to main ground line MGL.

Power supply switching transistors PS and NS have their gate insulation films set to be not smaller than 2.5 nm in thickness.

In the configuration of FIG. 31, in a standby state, switch control signal SW attains an L level (logical low level), and CMOS inverter CIV outputs a signal of an H level (logical high level). Responsively, power supply switching transistors NS and PS both turn off. Sub power supply line FPL and sub ground line SCL are each set to a floating state, and the output states of inverters IVa and IVb become unstable.

The voltage levels of sub power supply line SPL and sub ground line SGL in the standby state are determined by a leak current of the logic circuit. Transistor parameters vary within a permissible range for each chip, the voltage levels of the sub power supply and ground lines cannot be maintained at predetermined voltage levels. Accordingly, the sub ground and power supply lines are different in voltage for different chips, and inverters IVa and IVb, when transitioning to an active cycle, are different in output voltage level.

Thus, it is necessary to determine a circuit operation timing with a worst case considered, and high speed and stable operation cannot be achieved.

Furthermore, in Japanese Patent Laying-Open No. 11-150193, in order to reduce the gate leak current in inverters IVa and IVb, well regions of MIS transistors QPT and QNT are isolated from each other. This results in a disadvantageously increased layout area in the case of an increased number of stages of inverters IVa and IVb.

Moreover, gate to source voltage Vgs of each of power supply switching transistors PS and NS in a conductive state is the power supply voltage VCC level. If power supply voltage VCC is set to an L level, power supply switching transistors PS and NS cannot enter a sufficiently deep on state and, in the active cycle, sub power supply and ground lines SPL and SGL cannot be held stably at prescribed power supply and ground voltage levels, respectively. In particular, if power supply noise is generated, the noise cannot be absorbed rapidly, a circuit cannot be operated stably, and the noise reduces a circuit operating margin.

Furthermore, if driving ability of the power supply switching transistor cannot be increased sufficiently, the sub power supply and ground lines cannot be driven rapidly to prescribed voltage levels in transition from the off state to an on state. Consequently, a certain period of time is required before an operation starts, which is an obstacle against high speed operation.

SUMMARY OF THE INVENTION

It is an object of the present invention to provide a semiconductor device capable of reducing a current dissipation in a standby state with a simple circuit configuration.

It is another object of the present invention to provide a semiconductor device capable of more reliably reducing a current consumed in a standby state and of achieving a high speed operation in transition to an active cycle.

A semiconductor device according to a first aspect of the present invention includes: a logic gate constructed of an insulated gate field effect transistor having a first gate insulation film, and receiving a voltage of an internal power node as an operating power source voltage to operate, for processing a signal having a first amplitude; and a first switching transistor connected between the internal power node and a first power source node, having a second gate insulation film greater in thickness than the first gate insulation film, and responsive to a switch control signal of a second amplitude greater than the first amplitude for selectively rendered conductive to electrically couple the first power source node and the internal power node together.

A semiconductor device according to a second aspect of the present invention includes: a logic gate constructed of an insulated gate field effect transistor having a first gate insulation film, and receiving a voltage of an internal power node as an operating power supply voltage to operate, for processing a received signal; a first switching transistor connected between the internal power node and a first power source node, having a second gate insulation film greater in thickness than the first gate insulation film, and responsive to a switch control signal to be selectively rendered conductive, for electrically coupling the first power source node and the internal power node together; and a switch circuit for switching an amplitude of the switch control signal in response to an amplitude control signal.

A semiconductor device according to an third aspect of the present invention includes: a logic gate including, as a component, an insulated gate field effect transistor having a first gate insulating film, receiving a voltage of a internal power node as an operating power supply voltage to process a received signal; a first switching transistor connected between the internal power node and a first power source node, having a gate insulation film greater in thickness than the first gate insulation film, responsive to a switch control signal to be selectively made conductive for electrically coupling the first power source node and the internal power node together; and a precharge circuit selectively enabled in response to an operation mode instruction signal instructing a mode of operation of the logic gate to precharge the internal power node to a prescribed voltage level.

According to the arrangements as described above, a power source line can be reinforced in an active cycle and a logic circuit can quickly be operated and the power supply switching transistor can be reliably kept in an off state to reduce a leak current during a standby state.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 21 shows a configuration of the semiconductor device according to a fifth embodiment of the present invention;

DESCRIPTION OF THE PREFERRED EMBODIMENTS

First Embodiment

Figure 1:
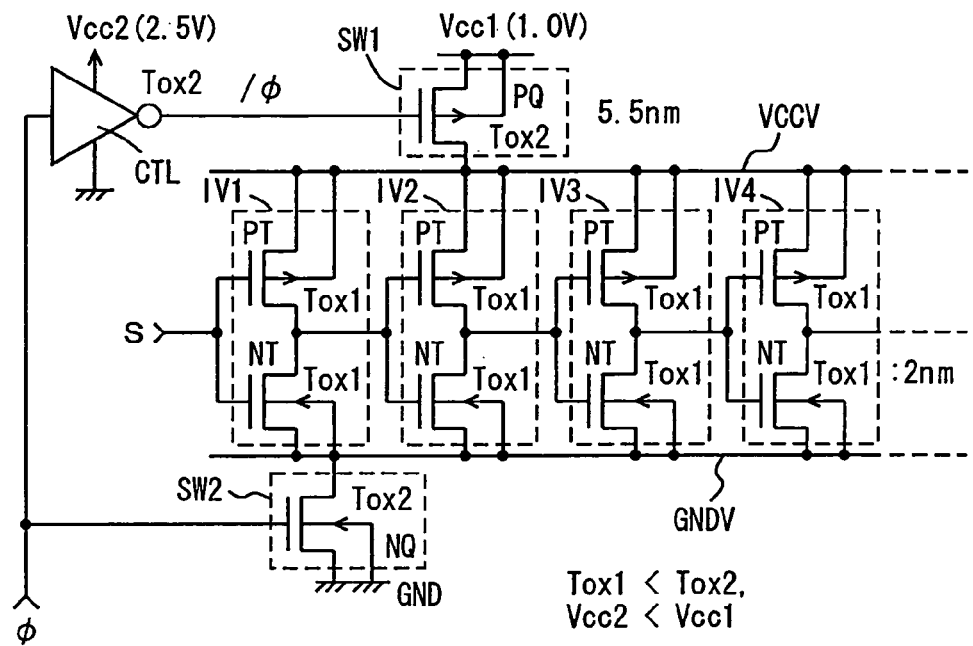
FIG. 1 shows a configuration of a semiconductor device according to a first embodiment of the present invention.

FIG. 1 shows a configuration of a semiconductor device according to the present invention in a first embodiment. In FIG. 1, the semiconductor device includes, as an internal function circuit, CMOS inverters IV1 to IV4 cascaded in four stages by way of example. CMOS inverters IV1 to IV4 each include a p channel MIS transistor PT and an n channel MIS transistor NT. MIS transistors PT and NT each have a gate insulation film having a thickness Tox1, for example, of 2 nm.

The p channel MIS transistors of CMOS inverters IV1 to IV4 have their respective sources and substrate regions (or backgates) connected commonly to a high-side virtual power source line (hereinafter simply referred to as a virtual power supply line) VCCV. The n channel MIS transistors of CMOS inverters IV1 to IV4 have their respective sources and substrate regions connected commonly to a low-side virtual power source line (hereinafter simply referred to as a virtual ground line) GNDV.

Virtual power supply line VCCV is coupled with a power supply node via a switching transistor SW1, and virtual ground line GNDV is connected to a ground node via a switching transistor SW2.

Switching transistor SW1 is comprised of a p channel MIS transistor having a gate insulation film with a thickness Tox2. P channel MIS transistor PQ has its source and backgate connected to a power supply node supplying a power supply voltage Vcc1, for example, of 1.0V.

Switching transistor SW2 is comprised of an n channel MIS transistor having a gate insulation film with thickness Tox2. N channel MIS transistor NQ has its source and backgate connected to a ground node. Thickness Tox2 of the gate insulation film is, for example, 5.5 nm.

Switching transistor SW1 receives a switch control signal /φ from a CMOS inverter CTL at a gate thereof, and switching transistor SW2 receives a switch control signal φ at a gate thereof. CMOS inverter CTL receives a power supply voltage Vcc2 and a ground voltage as operating power supply voltages. Power supply voltage Vcc2 is, for example, 2.5V, which is higher than power supply voltage Vcc1. CMOS inverter CTL is similar in configuration to CMOS inverters IV1 to IV4 shown in FIG. 1 and its constituent p- and n-channel MIS transistors each have a gate insulation film with thickness Tox2.

Inverter IV1 at an initial input stage of CMOS inverters IV1 and IV4, receives an input signal S. Input signal S has an amplitude corresponding to power supply voltage Vcc1. Switch control signals φ and /φ are control signals having an amplitude Vcc2 larger than the voltage Vcc1, and they are set to an L level or an H level depending on a mode of operation of CMOS inverters IV1 to IV4.

Figure 2:
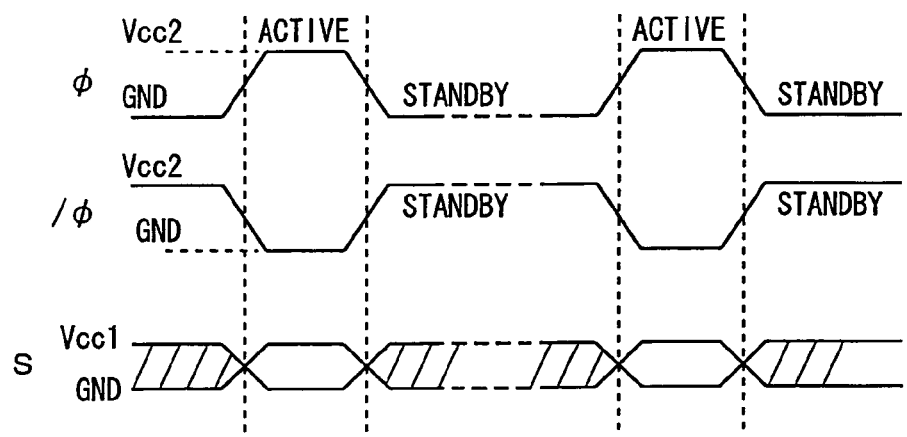
FIG. 2 is timing chart representing an operation of the semiconductor device shown in FIG. 1.

FIG. 2 is timing chart representing an operation of the semiconductor device shown in FIG. 1. With reference to FIG. 2, an operation of the semiconductor device shown in FIG. 1 will now be described.

When this semiconductor device is in a standby state, input signal S is in an indefinite state. In the standby state, switch control signal φ is at the ground voltage GND level and complementary switch control signal /φ output from CMOS inverter CTL is at the level of the voltage Vcc2.

In power supply switch circuit SW1, MIS transistor PQ receives the voltage Vcc2 at the gate and the voltage Vcc1 at the source, and its gate to source voltage becomes a deep, reverse bias state. Accordingly, an off leak current can further be reduced in MIS transistor PQ, and a leak current flowing to virtual power supply line VCCV from a power supply node through power switch circuit SW1 can be suppressed sufficiently. In addition, power supply switch circuit SW2 also has its MIS transistor NQ made nonconductive in the standby state.

If a gate tunnel current flows in CMOS inverters IV1 to IV4 and the voltage level of virtual ground line GNDV increases, a voltage ascent on the virtual ground line GNDV is caused by a supply of a current from virtual power supply line VCCV. Therefore, the voltage level of the virtual power supply line VCCV accordingly decreases, the gate potential of the MIS transistor causing a gate tunnel current flow varies accordingly, the MIS transistor in the on state is driven substantially to the off state, to cut off a path of the gate tunnel current flow.

In this state, CMOS inverters IV1 to IV4 each enter substantially an output high impedance state. The voltage level of virtual power supply line VCCV and virtual ground line GNDV are set to the level, at which a leak current flowing through power supply switch circuits SW1 and SW2 balances a leak current flowing through inverters IV1 to IV4.

When an active cycle starts and an operation on the input signal S is performed, switch control signal φ rises to the level of the voltage Vcc2, while complementary switch control signal /φ output from CMOS inverter CTL falls to a ground voltage level. Responsively, in power supply switch circuits SW1 and SW2, MIS transistors PQ and NQ turn conductive, virtual power supply line VCCV is coupled with a power supply node, and virtual ground line GNDV is connected to a ground node.

Switch control signal φ is at the level of the voltage Vcc2, which is higher than the voltage Vcc1. In power supply switch circuit SW2, MIS transistor NQ enter a deeper on state to reliable fix the voltage of virtual ground line GNDV to the ground voltage level. Accordingly, the voltage level of virtual ground line GNDV can be rapidly stabilized and a noise generated in operation on the virtual ground line can be reliably absorbed. Even if MIS transistor NQ has a gate insulation film as thick as Tox2, stable ground voltage GND can be supplied to virtual ground line GNDV and CMOS inverters IV1 to IV4 can be operated stably.

Even if CMOS inverters IV1 to IV4 are configured to use an MIS transistor having a gate insulation film with thickness Tox, for example, of 2.0 nm, they can be operated stably at high speed in the active cycle.

Figure 3:
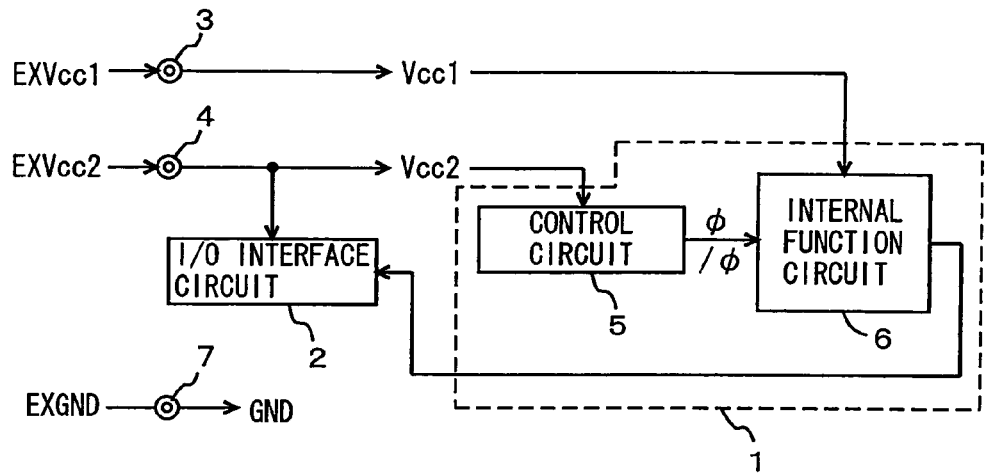
FIG. 3 schematically shows a configuration of a power supply of the semiconductor device according to the present invention in the first embodiment.

FIG. 3 shows an example of a configuration of a portion for generating power supply voltages Vcc1 and Vcc2. In FIG. 3, the semiconductor device includes an internal circuit 1 and an I/O interface circuit 2 allowing transmission of signal/data between the internal circuit 1 and an external device or unit. Internal circuit 1 includes an internal function circuit 6 containing CMOS inverters IV1 to IV4 and power supply switch circuits SW1 and SW2 shown in FIG. 1, and a control circuit 5 for generating switch control signals φ and /φ controlling a power supply of internal function circuit 6.

Signal/data is transferred between internal function circuit 6 and I/O interface circuit 2. Control circuit 5 may receive an operation mode instruction signal via I/O interface circuit 2 to generate switch control signals φ and /φ in response to the operation mode instruction signal (instructing a mode of operation of internal function circuit 6).

Power supply voltage Vcc1 is generated in accordance with an external power supply voltage EXVcc1 applied externally via a power supply node 3, and power supply voltage Vcc2 is generated from a power supply voltage EXVcc2 applied externally via a power supply node 4. Therefore, power supply voltages Vcc1 and Vcc2 have their voltage levels determined by external power supply voltages EXVcc1 and EXVcc2. Power supply voltage Vcc2 is supplied to I/O interface circuit 2 and control circuit 5, and power supply voltage Vcc1 is supplied to internal function circuit 6.

Via an external ground node 7, a ground voltage EXGND is supplied, and an internal ground voltage GND is produced. Ground voltage GND may be supplied to I/O interface circuit 2 and to internal function circuit 6 separately. I/O interface circuit 2 receives ground voltage GND through a terminal (node) and internal function circuit 6 and control circuit 5 receive ground voltage GND through a separate another terminal (or node), in order to prevent an operation of I/O interface circuit 2 inputting and outputting a signal/data from adversely affecting an operation of internally provided control circuit 5 and internal function circuit 6.

The two kinds of power supply voltages EXVcc1 and EXVcc2 are externally applied as shown in FIG. 3, and thus, internal power supply voltages Vcc1 and Vcc2 can be readily produced without necessity of providing a particular, internal voltage generation circuit.

Figure 4:
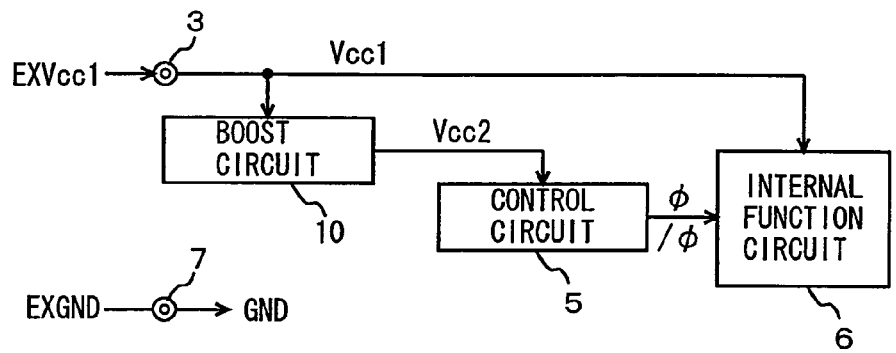
FIG. 4 schematically shows a configuration of a modification of the power supply of the semiconductor device in the first embodiment according to the present invention.

FIG. 4 shows another configuration of the portion for generating power supply voltages Vcc1 and Vcc2. In FIG. 4, internal power supply voltage Vcc1 is generated from an external power supply voltage EXVcc applied externally through power supply node 3. Power supply voltage Vcc2 is generated by a boost circuit 10 for boosting power supply voltage Vcc1. Power supply voltage Vcc1 is supplied to logic circuit 6 and power supply voltage Vcc2 from boost circuit 10 is supplied to control circuit 5. Control circuit 5 outputs switch control signals φ and /φ applied to a power supply switch circuit included in internal function circuit 6. Internal function circuit 6 includes the CMOS inverter and the power supply switch circuit as shown in FIG. 1.

Through a ground node 7, ground voltage EXGND is supplied and internal ground voltage GND is generated.

In the power supply configuration shown in FIG. 4, power supply voltages Vcc1 and Vcc2 are produced from external power supply voltage EXVcc1. In particular, by generating the power supply voltage vcc2 through the use of boost circuit 10, power supply voltage Vcc2 at a desired voltage level can be generated. Generating power supply voltage Vcc2 in boost circuit 10 provided internal to the semiconductor device can eliminate the necessity of externally, constantly supplying a voltage corresponding to power supply voltage Vcc2, and alleviate a requirement on a power supply of a system to which the semiconductor device is applied. Boost circuit 10 is constructed, for example, by a charge pump circuit utilizing a charge pumping operation of a capacitor.

Using boost circuit 10 to generate power supply voltage Vcc2 allows generation of power supply voltage Vcc2 at an optimal voltage level. Thus, in the standby, an MIS transistor at a high-side power source switch circuit is set to a deeper off state, to reduce an off leak current, and in an active operation, an MIS transistor at a low-side power source switch circuit can be set to a deeper on state, an impedance of the ground line can be reduced to stabilize a ground voltage.

Figure 5:
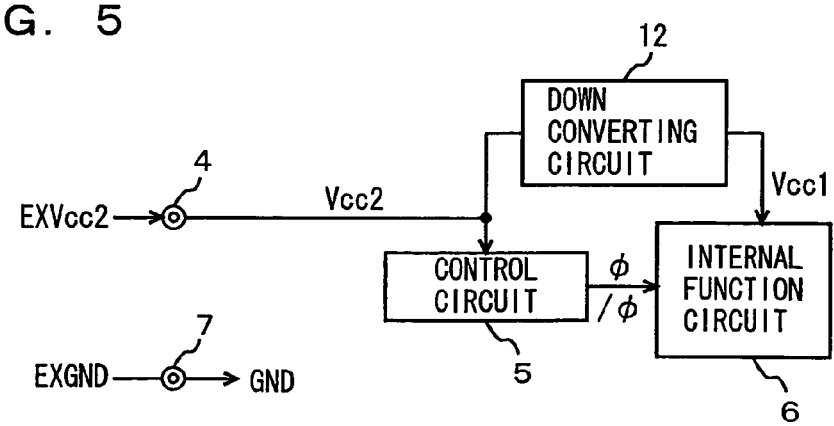
FIG. 5 shows a further configuration of the power supply of the semiconductor device according in the first embodiment of the present invention.

FIG. 5 schematically shows a further configuration of the circuit for generating power supply voltages Vcc1 and Vcc2. In the arrangement of FIG. 5, internal power supply voltage Vcc2 is generated from external power supply voltage EXVcc2 supplied from a power supply node 4 and is supplied to control circuit 5 as an operating power supply voltage. A down converting circuit 12 down-converts internal power supply voltage Vcc2 to generate power supply voltage Vcc1. Internal function circuit 6 is supplied from down converting circuit 12 with power supply voltage Vcc1. Control circuit 5 generates switch control signals φ and /φ of an amplitude of Vcc2, as in the arrangement described in the arrangement shown in FIGS. 3 and 4.

Ground voltage GND is generated in accordance with external ground voltage EXGND supplied to ground node 7 and is supplied to control circuit 5 and internal function circuit 6.

With down-converting circuit 12 to generate power supply voltage Vcc1 to internal function circuit 6, if external power supply voltage EXVcc2 can be used as a system power supply, power supply voltage Vcc1 can be generated at a desired voltage level to be supplied to internal function circuit 6. Power supply voltage Vcc1 can be set to an optimal level accommodating for an operation condition of internal function circuit 6.

First Modification

Figure 6:
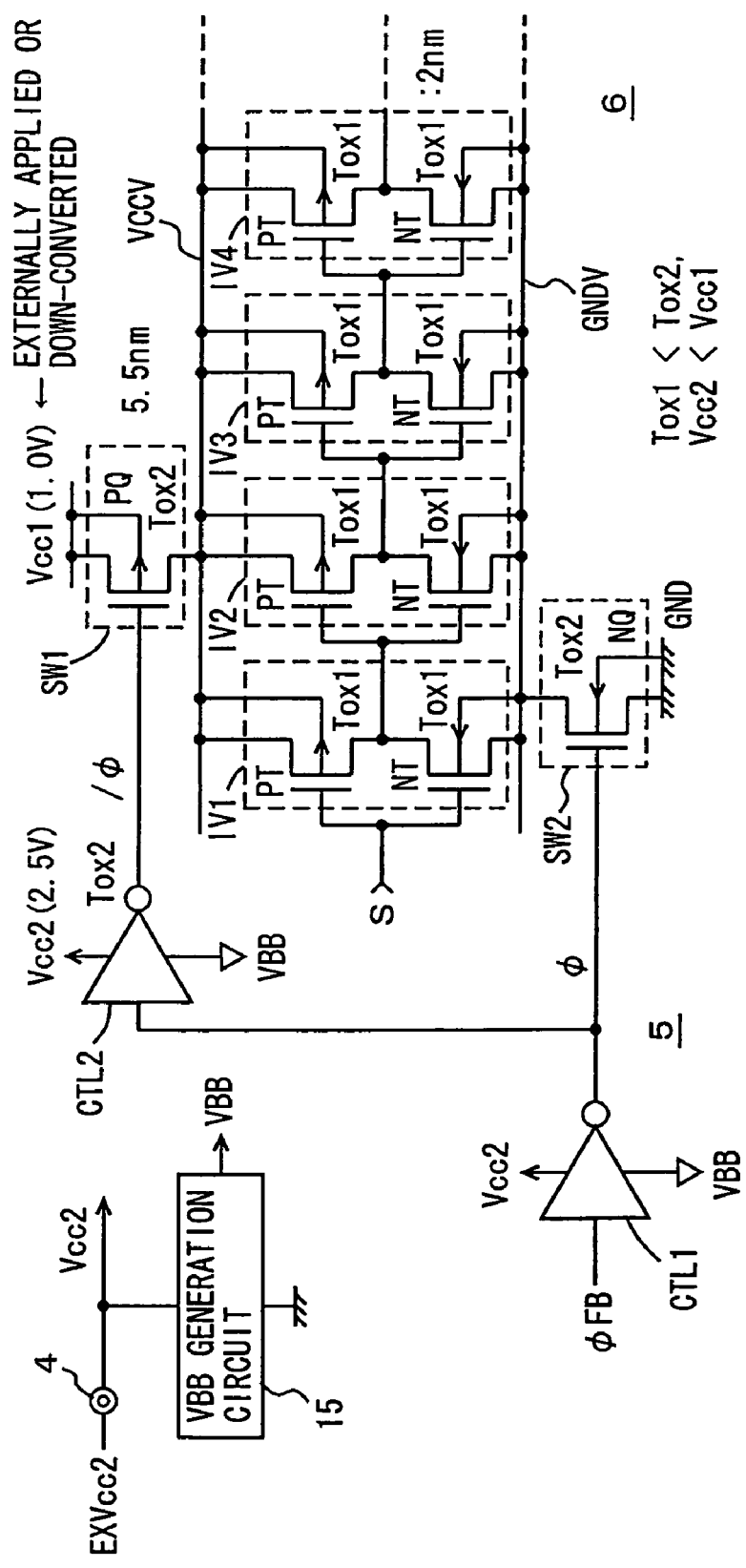
FIG. 6 shows a modification of the first embodiment according to the present invention.

FIG. 6 shows a configuration of the semiconductor device of a first modification of the first embodiment. In the configuration of FIG. 6, in control circuit 5 generating switch control signals φ and /φ, there are provided an inversion circuit CTL1 having a level conversion function and receiving a mode instructing signal φFB, and a CMOS inverter CTL2 receiving a signal from inversion circuit CTL1 to generate switch control signal /φ.

Inversion circuit CTL1 and CMOS inverter CTL2 receive power supply voltage Vcc2 and a negative voltage VBB as operating power supply voltages. Therefore, switch control signals φ and /φ changes between the voltage Vcc2 and negative voltage VBB.

Negative voltage VBB is generated from a VBB generation circuit 15 receiving power supply voltage Vcc2 to generate negative voltage VBB through, for example, a charge pumping operation. Power supply voltage Vcc2 is generated from external power supply voltage EXVcc2 supplied to power supply node 2.

Internal function circuit 6 shown in FIG. 6 has the same configuration as that shown in FIG. 1. Accordingly, like components are denoted by like reference characters and detailed description thereof will not be repeated.

Figure 7:
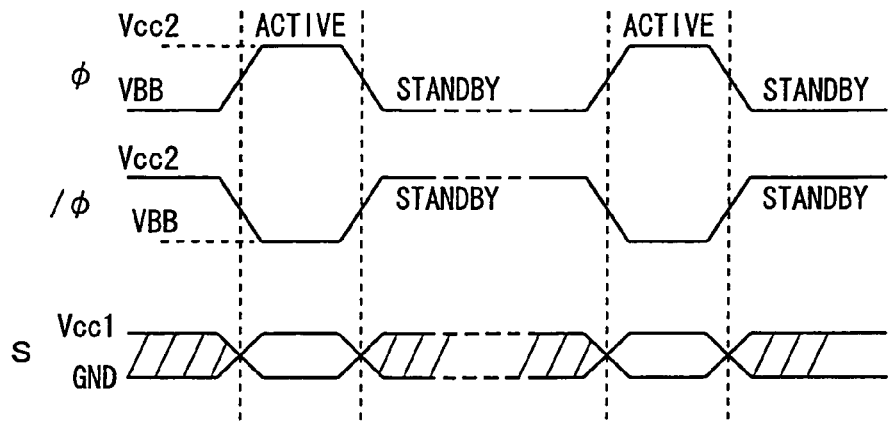
FIG. 7 is timing chart representing an operation of the semiconductor device shown in FIG. 6.

FIG. 7 is timing chart representing an operation of the semiconductor device shown in FIG. 6. With reference to FIG. 7, the operation of the FIG. 6 semiconductor device will now be described.

VBB generation circuit 15 generates negative voltage VBB from power supply voltage Vcc2. In a standby cycle, mode instructing signal φFB is at the H level and inversion circuit CTL1 with the level conversion function outputs switch control signal φ at a negative voltage VBB level. CMOS inverter CTL2 outputs switch control signal /φ at a level of power supply voltage Vcc2. In power supply switch circuit SW2, MIS transistor NQ receives negative voltage VBB at a gate thereof and enters a deep reverse bias state between the gate and the source, to sufficiently suppress an off leak current. In power supply switch circuit SW1, MIS transistor PQ receives power supply voltage Vcc2 higher than the source voltage Vcc1 at the gate, to be in a deep off state. Therefore, in the standby cycle, an off leak current in power supply switch circuits SW1 and SW2 can reliably be reduced. Accordingly, a gate tunnel current and an off leak current can be reduced in CMOS inverters IV1 to IV4 to reduce a current consumption in the standby cycle.

In the active cycle, mode instructing signal φFB attains the L level, and inversion circuit CTL1 with the level conversion function outputs switch control signal φ at the power supply voltage Vcc2 level and CMOS inverter CTL2 outputs switch control signal /φ of the negative voltage VBB level. Thus, in power supply switch circuits SW1 and SW2, MIS transistors PQ and NQ enter a deep on state, and virtual power supply line VCCV and virtual ground line GNDV are reliably fixed at the power supply voltage Vcc1 level and the ground voltage GND level, respectively. CMOS inverters IV1-IV4 accordingly operate stably.

Furthermore, when the standby cycle transitions to the active cycle, the voltage levels of virtual power supply line VCCV and virtual ground line GNDV can quickly be stabilized, to operate a logic circuit at high speed.

Note that power supply voltage Vcc1 may be generated by down-converting power supply voltage Vcc2 or may be supplied externally.

As described above, in accordance with the first embodiment of the present invention, a control signal of a power supply switch transistor between a virtual power source line and a power source node is made larger in amplitude than an input signal of a logic circuit receiving a voltage of the virtual power source line as an operating power source voltage. Thus, in a standby state, a power supply switch circuit can be set to a deeper off state, a leak current can be reduced in the standby. Furthermore, in an active cycle, the power supply switch circuit can be set to a deep on state, the virtual power source line can reliably be fixed at a prescribed voltage level, power source noise can be reduced, and a logic circuit can operate stably.

Herein, the virtual power source line generally refers to a virtual power supply line and a virtual ground line and corresponds to a first power supply node. A power source node corresponds to an internal power node.

Second Embodiment

Figure 8:
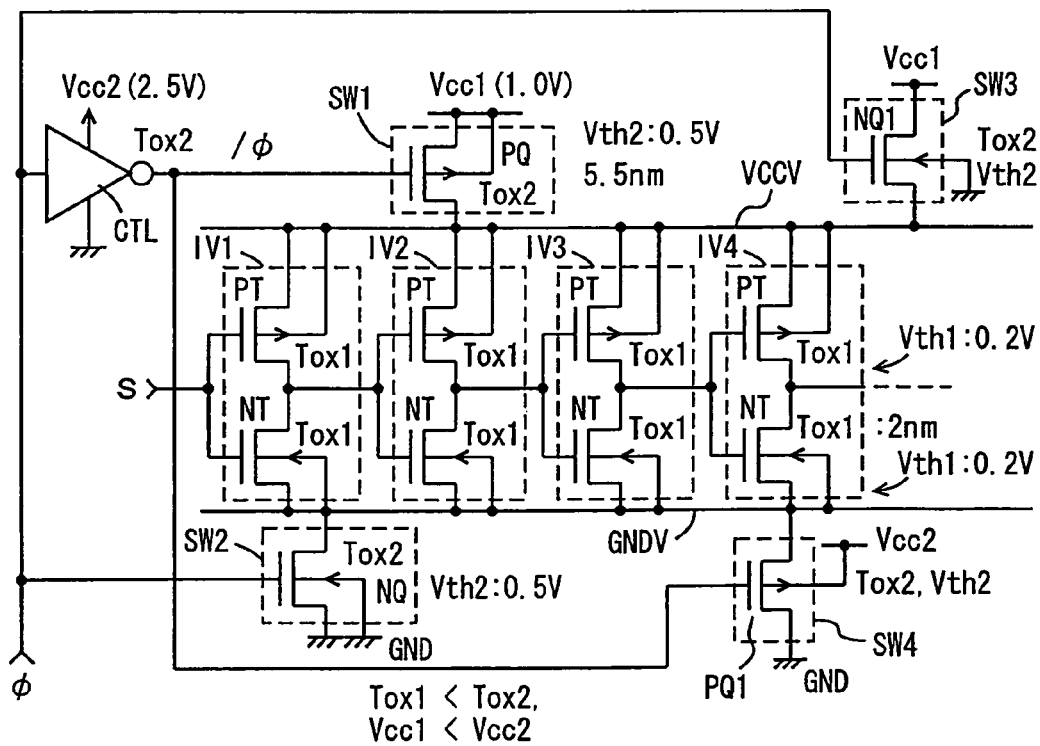
FIG. 8 shows a configuration of the semiconductor device according to the present invention in a second embodiment.

FIG. 8 shows a configuration of the semiconductor device according to a second embodiment of the present invention. The semiconductor device shown in FIG. 8 includes, in addition to the configuration of the semiconductor device shown in FIG. 1, a power supply switch circuit SW3 provided between a virtual power supply line VCCV and a power supply node receiving power supply voltage Vcc1 and a power supply switch circuit SW4 provided between virtual ground line GNDV and a ground node.

Power supply switch circuit SW3 is constructed of an n-channel MIS transistor NQ1 connected between a power supply node receiving power supply voltage Vcc1 and virtual power supply line VCCV, and having its gate receiving switch control signal φ and its backgate connected to a ground node. N channel MIS transistor NQ1 has a gate insulation film of thickness Tox2.

Power supply switch circuit SW4 is constructed of a p channel MIS transistor PQ1 connected between virtual ground line GNDV and a ground node, and having its gate receiving a complementary switch control signal /φ from CMOS inverter CTL and its backgate connected to a power supply node supplying power supply voltage Vcc2. P channel MIS transistor PQ1 has a gate insulation film of thickness Tox2.

In the semiconductor device shown in FIG. 8, an MIS transistor having a gate insulation film of thickness Tox1 has a threshold voltage Vth1 in absolute value set, for example, to 0.2V. An MIS transistor having a gate insulation film of thickness Tox2 has a threshold voltage Vth2 in absolute value set, for example, to 0.5V. Power supply voltage Vcc1 is 1.0V and power supply Vcc2 is 2.5V.

The other configuration of the semiconductor device shown in FIG. 8 is the same to the configuration of the semiconductor device shown in FIG. 1. Accordingly, like components are denoted by like reference characters and their detailed description will not be repeated.

In the standby cycle, switch control signal φ is at the ground voltage GND level, as described with reference to the semiconductor device shown in FIG. 1. In this state, CMOS inverter CTL outputs switch control signal /φ at the level of power supply voltage Vcc2. Therefore, in power supply switch circuit SW1, MIS transistor PQ is in a deep off state. In power supply switch circuit SW3 also, MIS transistor NQ1 enters an off state in response to switch control signal φ. MIS transistor NQ1 has a gate insulation film of thickness Tox2 and a threshold voltage in absolute value Vth2 of 0.5V, and an off leak current is sufficiently be suppressed.

Furthermore, in power supply switch circuits SW2 and SW4 also, MIS transistors NQ and PQ1 are both in the off state. They have a threshold voltage in absolute value Vth2 of 0.5V, and sufficiently suppress the off-leak current even in state of a gate to source voltage of 0 V.

When an active cycle starts, switch control signal φ rises to the level of power supply voltage Vcc2 and CMOS inverter CTL outputs switch control signal /φ falling to the ground voltage level. In this state, in power supply switch circuits SW1 and SW3, MIS transistors PQ and NQ1 both turn on. MIS transistor PQ has a gate to source voltage of +1.0V, whereas in power supply switch circuit SW3, MIS transistor NQ 1 has a gate to source voltage of 1.5V. Therefore, the on-resistance of MIS transistor NQ1 can be made lower than that of MIS transistor PQ and in the active cycle, virtual power supply line VCCV can reliably be reinforced to be fixed at power supply voltage Vcc1 and power supply noise can be suppressed.

For virtual ground line GNDV also, in power supply switch circuit SW2, MIS transistor NQ has a gate to source voltage of 2.5V and virtual ground line GNDV is reliably fixed at the ground voltage level. In this case, in power supply switch circuit SW4, MIS transistor PQ1 receives, at its gate, ground voltage GND and clamps the voltage level of virtual ground line GNDV to the level of absolute value Vth2 of the threshold value thereof, i.e., 0.5V. When the voltage level of virtual ground line GNDV exceeds absolute value Vth2 of the threshold value of MIS transistor PQ1, MIS transistor PQ1 turns conductive to discharge virtual ground line GNDV to the ground voltage GND level, to prevent generation of a large noise on virtual ground line GND.

Note that switch control signal φ may be a signal changing between power supply voltage Vcc2 and negative voltage VBB. In this case, CMOS inverter CTL is supplied with negative voltage VBB as a low-side power source voltage. An off-leak current of a power source line in the standby state can further be reduced and a virtual power source line in an active cycle can further be reinforced.

Modification

Figure 9:
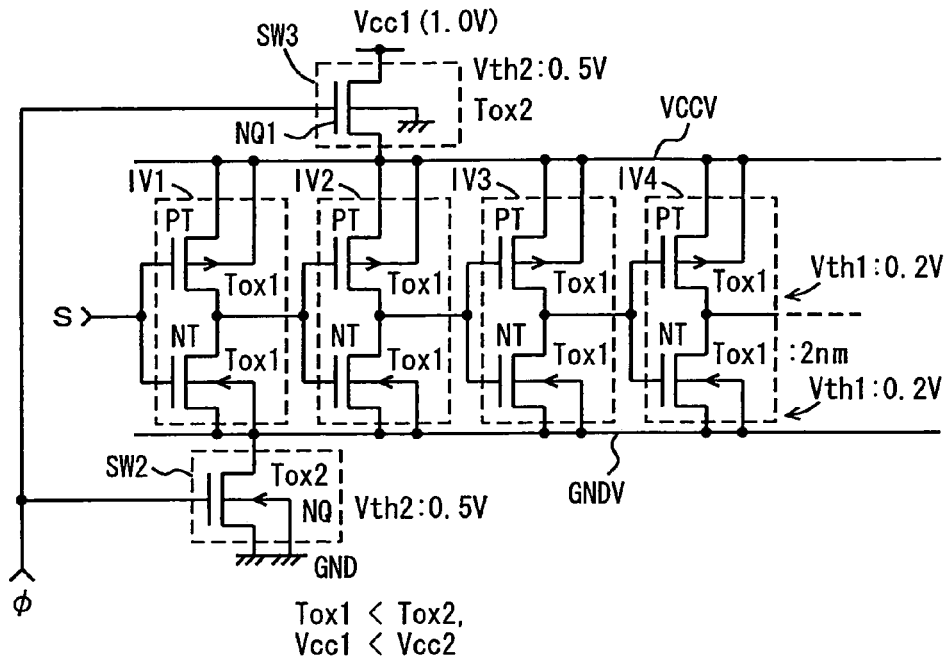
FIG. 9 shows a modification of the second embodiment according to the present invention.

FIG. 9 shows a configuration of a modification of the second embodiment. In FIG. 9, to virtual power supply line VCCV, power supply switch circuit SW3 is provided, and to virtual ground line GNDV, power supply switch circuit SW2 is provided. In FIG. 9, power supply switch circuits SW1 and SW4 shown in FIG. 8 are not provided. Accordingly, there is not provided CMOS inverter CTL inverting switch control signal φ. The other configuration of the semiconductor device shown in FIG. 9 is identical to the configuration of the semiconductor device shown in FIG. 8. Accordingly, corresponding components are denoted by like reference characters and their detailed description will not be repeated.

In the semiconductor device shown in FIG. 9, in the standby cycle, switch control signal φ is at the ground voltage level and in power supply switch circuit SW2, MIS transistor NQ is in the off state. In power supply switch circuit SW3, MIS transistor NQ1, having a gate to source voltage of −1.0V (Vcc1 is 1.0V), enters a deep off state, greatly isolates virtual power supply line VCCV from the power supply node, and suppresses a leak current in the standby cycle.

In an active cycle, switch control signal φ increases to the level of power supply voltage Vcc2 (2.5V). If p channel MIS transistor is solely used in a power supply switch circuit, then its gate to source voltage attains −1.0V in the active cycle. Where the threshold voltage in absolute value Vth2 is 0.5V, driving current by p channel MIS transistor in this power supply switch circuit may be inadequate. However, by using n channel MIS transistor NQ1 in power supply switch circuit SW3, in power supply switch circuit SW3, MIS transistor NQ1 has a gate to source voltage being 1.5V. If a threshold voltage Vth2 is 0.5V, MIS transistor NQ1 can still transmit power supply voltage Vcc1 of 1.0V to virtual power supply line VCCV sufficiently with a larger current drive ability.

Furthermore, where an n channel MIS transistor, which is high in charge mobility, is used, virtual power supply line VCCV can be supplied with stable power supply voltage Vcc1 with a smaller occupied area than when a p channel MIS transistor is used as a switching transistor in the power supply circuit.

Furthermore, it is not necessary to generate complementary switch control signals for power supply control, and accordingly, a circuit for power supply control can have a reduced layout area.

Furthermore, in power supply switch circuit SW2 also, MIS transistor NQ has a gate to source voltage of 2.5V (=Vcc2), and virtual ground line GNDV is accurately held at the ground voltage GND level. Accordingly, virtual power supply line VCCV and virtual ground line GNDV can be reliably fixed at prescribed voltage levels and inverters IV1 to IV4 can be operated stably.

If switch control signal φ changes between negative voltage VBB and power supply voltage Vcc2, a p channel MIS transistor may be used for high and low side power supply switch circuits. In the standby state, an off leak current can be reduced and a power supply can be stabilized in the active cycle.

In addition, power supply voltages Vcc1 and Vcc2 may be applied externally or internally generated, as described in the first embodiment.

As described so far, according to the second embodiment, in a power supply switch circuit, there is arranged an n channel MIS transistor having its gate receiving a control signal having an amplitude larger than a power supply voltage of a logic circuit. Thus, the power supply voltage can be supplied stably to a virtual power supply line in an active cycle and a logic circuit can operate stably.

Third Embodiment

Figure 10:
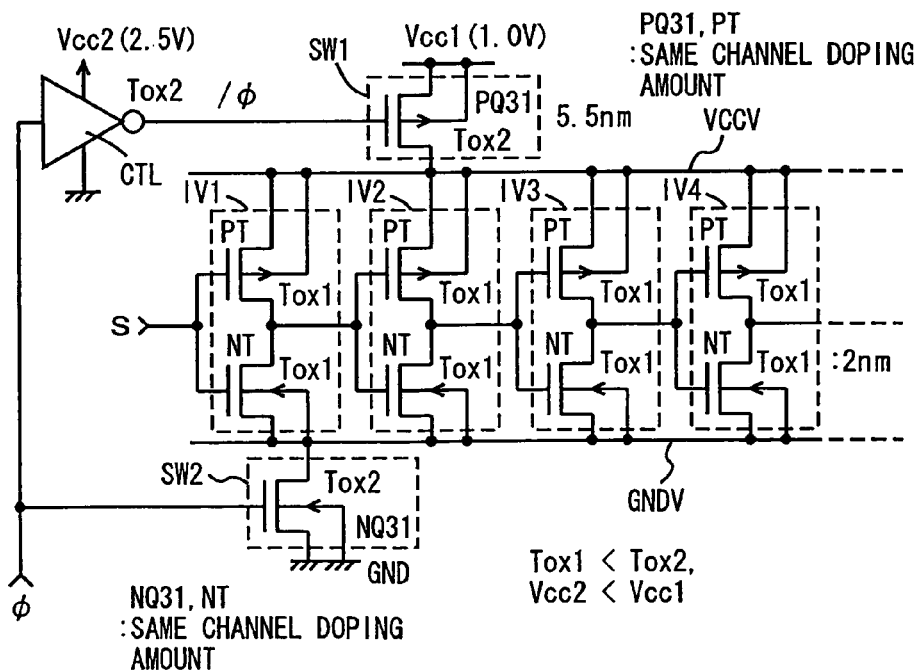
FIG. 10 shows a configuration of the semiconductor device according to the present invention in a third embodiment.

FIG. 10 shows a configuration of the semiconductor device according to the present invention in a third embodiment. The semiconductor device shown in FIG. 10 differs in configuration from the semiconductor device shown in FIG. 1 in the following points. The amount of dopant doped into the channel of a p channel MIS transistor PQ31 constructing power supply switch circuit SW1 is made equal to that of dopant into the channel of a p channel MIS transistor PT of CMOS inverters IV1 to IV4. MIS transistors PQ31 and PT have their respective gate insulation films of the thickness the same as described in the first embodiment, i.e., Tox2 and Tox1, respectively.

In addition, the amount of dopant doped into the channel of an n channel MIS transistor NQ31 constructing power supply switch circuit SW2 is equal to the amount of dopant doped into the channel of an n channel MIS transistor NT of CMOS inverters IV1 to IV4. MIS transistors NT and NQ31 have their respective gate insulation films of the thickness the same as described in the first embodiment, i.e., Tox1 and Tox2, respectively. The other configuration of the semiconductor device shown in FIG. 10 is the same as the configuration of the semiconductor device shown in FIG. 1. Accordingly, corresponding components are denoted by like reference characters and their detailed description will not be repeated.

The MIS transistor has its threshold voltage adjusted by doping impurities into its channel region. If an amount of impurities doped into an impurity region, i.e., an amount of dopant doped into a channel is the same, a gate insulation film of a larger thickness accompanies a threshold voltage of a larger absolute value. Therefore, the absolute value Vth2 of the threshold voltage of p channel MIS transistor PQ31 is greater than the absolute value Vth1 of the threshold voltage of p channel MIS transistor PT and the threshold voltage of n channel MIS transistor NQ31 becomes higher than that of n channel MIS transistor NT. MIS transistors PQ31 and NQ31 have a threshold voltage in absolute value of, for example, 0.5V and MIS transistors PT and NT have a threshold voltage in absolute value of, example, 0.2V.

In power supply switch circuits SW1 and SW2, MIS transistors PQ31 and NQ31 has an increased absolute value of threshold voltage, so that a subthreshold current in an off state can be reduced and a leak current in a standby state can further be reduced. By simply applying a so-called "dual gate insulation film process" in producing MIS transistors with gate insulation films of two kinds of thickness Tox1 and Tox2, a threshold voltage of MIS transistor for the power supply switching can be made different from the threshold voltage of MIS transistor for the logic circuit. Here, the "dual gate insulation film process" refers to the process of forming a gate insulation film of the same thickness and then using a mask to selectively form a thick gate insulation film to produce gate insulation films of two kinds of thickness.

As described so far, the amount of the impurity into the channel region of an MIS transistor in a power supply switch circuit is made equal to that of impurity into the channel region of an MIS transistor (PT, NT) of the same conductivity in the logic gate circuit and the thickness of the gate insulation film of the MIS transistor of the power supply switch circuit is greater than that of the gate insulation film of the MIS transistor of the logic gate circuit. Thus, the MIS transistor of the power supply switch circuit can readily have a threshold voltage larger in absolute value than the MIS transistor of the logic gate circuit and a leak current (a subthreshold current and a gate tunnel current) in a standby state can be reduced without complicating a fabrication process.

First Modification

Figure 11:
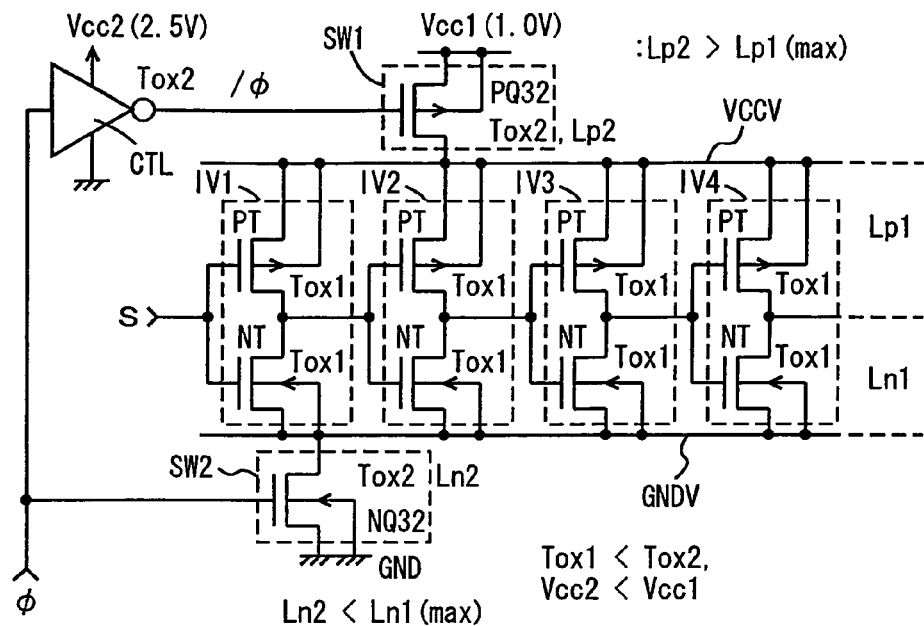
FIG. 11 shows a modification of the third embodiment according to the present invention.

FIG. 11 shows a configuration of the semiconductor device of a first modification in the third embodiment. The semiconductor device shown in FIG. 11 is different from the semiconductor device shown in FIG. 1 in the following points. In power supply switch circuit SW1, a p channel MIS transistor PQ22 has a channel length Lp2 made longer than an maximal value Lp1 (max) of a channel length Lp1 of p channel MIS transistors PT included in CMOS inverters IV1 to IV4.

In addition, in power supply switch circuit SW2, an n channel MIS transistor NQ32 has a channel length Ln2 made longer than a maximal value Ln1 (max) of a channel length Ln1 of n channel MIS transistors NT1 in CMOS inverters IV1 to IV4.

The other configuration of the semiconductor device shown in FIG. 11 is the same as the configuration of the semiconductor device shown in FIG. 1. Therefore, corresponding components are denoted by like reference characters and their detailed description will not be repeated.

In an MIS transistor, a threshold voltage is defined as a gate to source voltage supplying a drain current of a prescribed magnitude under the condition of application of a prescribed drain voltage. If a channel length is increased, a current supplying ability of an MIS transistor is reduced and accordingly the threshold voltage of the MIS transistor is increased in absolute value. More specifically, when the channel lengths of MIS transistors PQ32 and NQ32 are made longer than maximal channel lengths LP1 (max) and LN1 (max) of MIS transistors PT and NT of CMOS inverters IV1 to IV4, these power supply switching MIS transistors PQ32 and NQ32 have threshold voltages in absolute value larger than those of MIS transistors PT and NT of the logic circuit.

Figure 12:
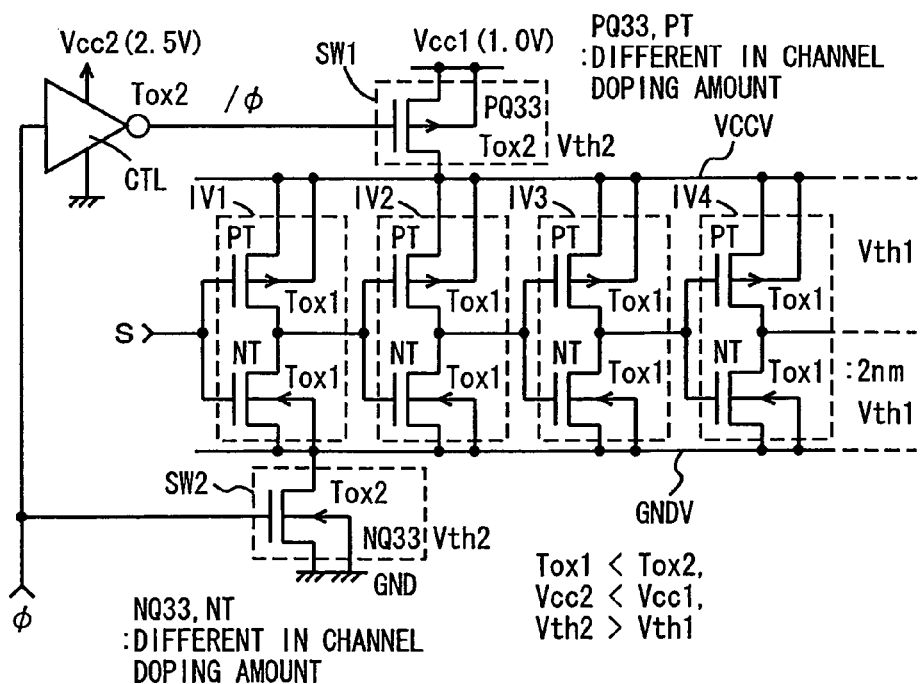
FIG. 12 shows another exemplary modification of the third embodiment according to the present invention.

If the threshold voltage is increased in absolute value, a leak current in the off state, i.e., a subthreshold current can be reduced. Accordingly, by simply changing a channel length, such off leak current of power supply switch circuits SW1 and SW2 can be reduced without complicating fabrication process, and accordingly a leak current (a gate tunnel current and a subthreshold current) of the logic circuit can be reduced and a current consumed in the standby state can be reduced Second Modification FIG. 12 shows a configuration of a second modification of the third embodiment. The semiconductor device shown in FIG. 12 is different in configuration from the semiconductor device shown in FIG. 1 in the following points. In power supply switch circuit SW1, the amount of dopant doped into the channel region of p channel MIS transistor PQ33 is made different from that of dopant doped into the channel region of p channel MIS transistor PT included in CMOS inverters IV1 to IV4. In this case, absolute value Vth2 of the threshold voltage of MIS transistor PQ33 is increased to be greater than absolute value Vth1 of the threshold voltage of MIS transistor PT.

In power supply switch circuit SW2, the amount of dopant doped into the channel region of n channel MIS transistor NQ33 is made different from that of dopant doped into the channel of n channel MIS transistor NT of CMOS inverters IV1 to IV4. In this case also, the threshold voltage Vth2 of n channel MIS transistor NQ33 is made larger than threshold voltage Vth1 of n channel MIS transistor NT.

Absolute value Vth1 of the threshold voltage is, for example, 0.2V and absolute value Vth2 of the threshold voltage is, for example, 0.5V.

In changing the channel dope amount, for p channel MIS transistors PQ33 and PT, when phosphorus (P) or any other n type impurity is doped into an n type substrate region, the amount of dopant doped into the channel of p channel MIS transistor PQ33 is made larger than that into the channel of MIS transistor PT. If boron (B) or any other p type dopant is doped into an n type substrate region of p channel MIS transistors PQ33 and PT, the channel dope amount for MIS transistor PQ33 is made smaller than that for p type MIS transistor PT. Thus, absolute value Vth2 of the threshold voltage of MIS transistor PQ33 can be set higher than absolute value Vth1 of the threshold value of MIS transistor PT.

As for n channel MIS transistors NQ33 and NT also, if a p type substrate region is subject to channel-doping with an n type impurity, the amount of dopant doped into the channel region of n channel MIS transistor NQ33 is made smaller than that into the channel region of MIS transistor NT. If a p type impurity is doped into the p type substrate region to adjust a threshold voltage, the amount of dopant doped into the channel region of MIS transistor NQ33 is made larger than that of dopant doped into the channel region of MIS transistor NT. Thus, the absolute value Vth2 of the threshold voltage of n channel MIS transistor NQ33 is made greater than the absolute value Vth1 of threshold voltage of MIS transistor NT.

In this case, the channel doping amount is adjusted to make greater the absolute value of the threshold voltage of MIS transistors PQ33 and NQ33, so that an off leak current of MIS transistors PQ33 and NQ33 in the standby state can be reduced to reduce a current consumed in the standby state.

The amounts of dopant doped into the channel regions of MIS transistors PQ33 and NQ33 in power supply switch circuits SW1 and SW2 are simply made different from the channel doping amounts for MIS transistors PT and NT in CMOS inverters IV1 to IV4 constructing the logic gate circuit. Without complicating the fabrication process, an off leak current can be readily reduced in the standby state and accordingly a current consumption can be reduced.

In the configuration shown in FIGS. 10 to 12, to power supply switch circuit SW1 receives switch, control signal /ϕ is at the ground voltage level in the active cycle. If power supply voltage Vcc1 is at a level higher than absolute value Vth2 of the threshold voltage of MIS transistors PQ31, PQ32 and PQ33 included in power supply switch circuit SW1, the power supply voltage Vcc1 can be reliably transmitted to virtual power supply line VCCV.

In power supply switch circuit SW2 also, switch control signal ϕ is at a level of the voltage Vcc2 higher than power supply voltage Vcc1. The condition Vcc2>Vth2 is met and virtual ground line GNDV is maintained stably at the ground voltage GND level.

In the third embodiment also, switch control signals ϕ and /ϕ each may be a signal changing between a negative voltage and power supply voltage Vcc2.

Furthermore, power supply voltages Vcc1 and Vcc2 may be generated as described in the first embodiment, i.e., may be generated externally or internally.

As described so far, according to the third embodiment, an MIS transistor constructing the power supply switch circuit and having a thick gate insulation film has a threshold voltage adjusted, through adjustment of channel doping amount or channel length to be greater in absolute value than that of an MIS transistor constructing the logic gate circuit. Thus, an off leak current in the power supply switch circuit in the standby state can be reduced and a current consumption in the standby can be reduced without complicating a fabrication process.

Fourth Embodiment

Figure 13:
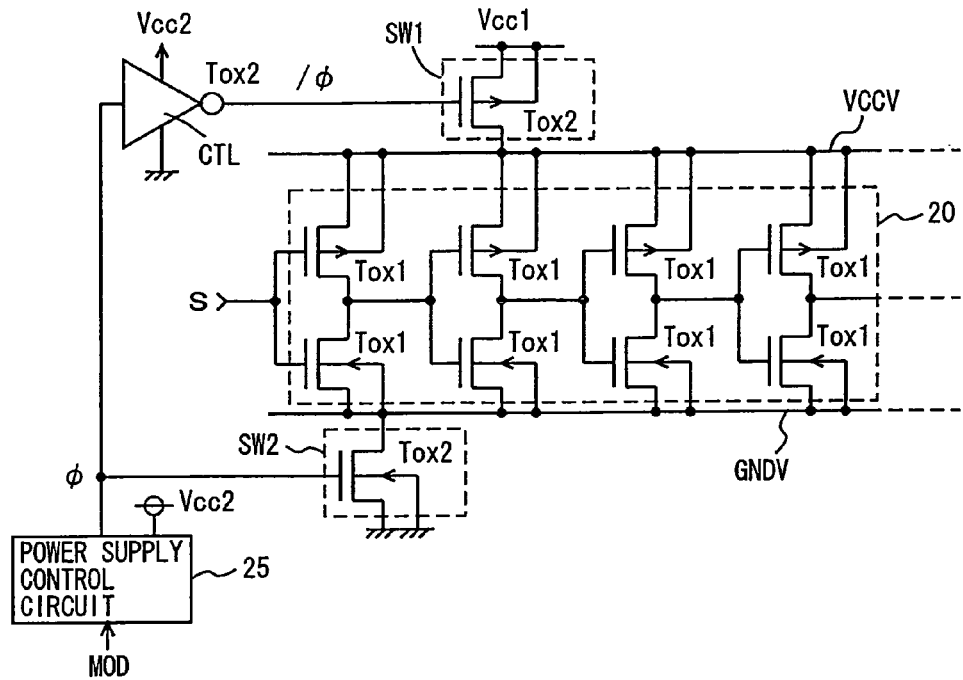
FIG. 13 shows a configuration of the semiconductor device according to a fourth embodiment of the present invention.

FIG. 13 shows a configuration of the semiconductor device according to a fourth embodiment of the present invention. In this configuration of the semiconductor device shown in FIG. 13, there is provided a logic gate circuit 20 receiving the voltages on virtual power supply and ground lines VCCV and GNDV as operating power supply voltages. Logic gate circuit 20 is constructed of CMOS inverters cascaded in four stages by way of example, as in the first to third embodiments. Their constituent p and n channel MIS transistors each have a gate insulation film of thickness Tox1.

To virtual power supply and ground lines VCCV and GNDV, power supply switch circuits SW1 and SW2 are provided, respectively. Power supply switch circuits SW1 and SW2 are constructed of p and n channel MIS transistors each having a gate insulation film of a thickness Tox2, respectively.

Power supply switch circuits SW1 and SW2 have their on/off states set by a power supply control circuit 25 and a CMOS inverter CTL. Power supply control circuit 25 generates switch control signal ϕ in accordance with a mode instructing signal MOD. CMOS inverter CTL receives and inverts switch control signal ϕ from power supply control circuit 25, to generate a complementary switch control signal /ϕ. Power supply control circuit 25 and CMOS inverter CTL receive power supply voltage Vcc2 as an operating power supply voltage. When made conductive, power supply switch circuits SW1 and SW2 transmit power supply voltage Vcc1 and ground voltage to virtual power supply and ground lines VCCV and GNDV, respectively.

Logic gate circuit 20 receives an input signal S of an amplitude corresponding to the voltage Vcc1.

In this semiconductor device, there are provided an active cycle, a standby cycle and a sleep mode. In the active cycle, the logic gate circuit 20 performs an operation on the input signal S. In the standby cycle, the logic gate circuit 20 waits for a next operation. In the sleep mode, a processing is halted over a long period of time. In the active cycle and the standby cycle, a system including the semiconductor device performs any processing, and the semiconductor device is in an operable state of performing a logical operational processing. Hereinafter, the active and standby cycles will generically be referred to as a "normal mode." Power supply control circuit 25 sets a state of switch control signal ϕ in accordance with mode instructing signal MOD.

Figure 14:
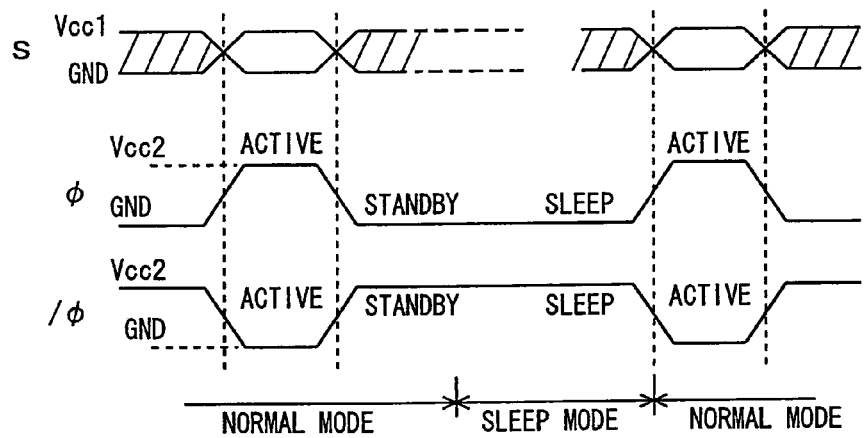
FIG. 14 is timing chart representing an operation of the semiconductor device shown in FIG. 13.

FIG. 14 is timing chart representing an operation of power supply control circuit 25 shown in FIG. 13. FIG. 14 also represents a state of input signal S applied to logic gate circuit 20. Input signal S has its state definite in the active cycle and indefinite in the standby cycle and the sleep mode.

In the active cycle, power supply control circuit 25 sets switch control signal ϕ to the level of power supply voltage Vcc2 in accordance with the mode instructing signal. CMOS inverter CTL outputs complementary switch control signal /ϕ at the ground voltage level. Accordingly, in the active cycle, virtual power supply and ground lines VCCV and GNDV receive power supply voltage Vcc1 and the ground voltage, respectively.

In the standby cycle and the sleep mode, power supply control circuit 25 sets switch control signal ϕ to the ground voltage level. In response, switch control signal /ϕ from CMOS inverter CTL is set to the level of the voltage Vcc2. Responsively, power supply switch circuits SW1 and SW2 are turned off, and virtual power supply and ground lines VCCV and GNDV are disconnected from power supply and ground nodes, respectively.

In the operation timing chart shown in FIG. 14, only in the active cycle in which logic gate circuit 20 actually operates on input signal S, virtual power supply and ground lines VCCV and GNDV are coupled with power supply and ground nodes, respectively. In control on the switch control signal as shown in FIG. 14, only in the active cycle, power supply switch circuits SW1 and SW2 turn into an operative state, to supply logic gate circuit 20 with an operating current. Therefore, control for power supply control circuit 25 can be facilitated, and an operating current is supplied to logic gate circuit 20 only for a required period of time and a current consumption can be reduced.

Figure 15:
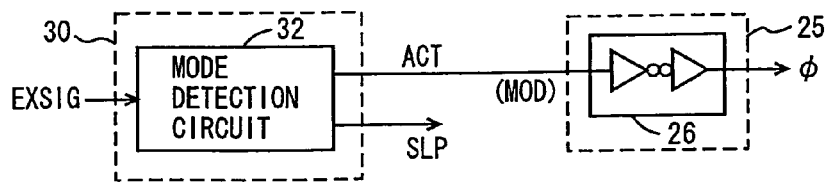
FIG. 15 shows a configuration of a portion generating a switch control signal shown in FIG. 13.

FIG. 15 schematically shows a configuration of a portion of generating mode instructing signal MOD and switch control signal ϕ shown in FIG. 13. In FIG. 15, a mode instructing signal generating portion includes a control circuit 30 receiving an externally applied control signal EXSIG to generate control signals instructing a variety of modes of operation.

In control circuit 30, there is provided a mode detection circuit 32 generating a mode instructing signal instructing a mode of operation designated in accordance with external control signal EXSIG. FIG. 15 shows an active cycle instructing signal ACT activated when the active cycle is designated and a sleep mode instructing signal SLP activated when the sleep mode is designated, as representative of operation mode instructing signals generated by mode detection circuit 32.

Power supply control circuit 25 includes a buffer circuit 26 receiving and buffering active cycle instructing signal ACT from mode detection circuit 32 as mode instructing signal MOD, to generate switch control signal ϕ.

Active cycle instructing signal ACT is held at the H level while the semiconductor device is in the active cycle. In response, switch control signal ϕ is at the H level. In the standby cycle, active cycle instructing signal ACT attains the L level and switch control signal φ responsively attains the L level.

In the semiconductor device in the sleep mode, an internal operation thereof is suspended, active cycle instructing signal ACT is at the L level, and switch control signal φ responsively also is set at the L level. Sleep mode instructing signal SLP is used to control an operation of a circuit portion not shown. Sleep mode instructing signal SLP may be used, for example, to fix an internal node at a prescribed potential in the sleep mode or to maintain a specific internal circuit (not shown) in a reset state in the sleep mode.

Mode detection circuit 32 is responsive to external control signal EXSIG for generating mode instructing signals ACT and SLP. However, where a counter provided internal to the semiconductor device performs a counting operation and the sleep mode is designated in accordance with an output of the counter when no operational processing in performed for a predetermined period of time, mode detection circuit 32 receives a sleep mode instructing signal from the timer, in place of the external control signal.

A signal of a logical sum of an inverted signal of active cycle instructing signal ACT, i.e., ZACT and sleep mode instructing signal SLP may be used as switch control signal φ. Complementary active cycle instructing signal ZACT is set at the H level in the standby cycle. In this configuration, even if active cycle instructing signal ACT is erroneously activated in the sleep mode, the power supply switch circuit can be maintained in the off state.

If the semiconductor device is a dynamic random access memory (DRAM), a self refresh mode is set in the sleep mode and memory cell data are refreshed in predetermined periods, switch control signal φ for circuit related to a refresh operation is activated in the refresh operation. In a circuit not related to the refresh operation, such as column-related circuit, the power supply switch circuit, in the sleep mode, is maintained in the off state in response to switch control signal φ. As active cycle instructing signal ACT, an array activation signal is used to generate a switch control signal for a power supply switch circuit arranged for a row-related circuit. Thus, in the self refresh mode in which refreshing is effected, a refreshing circuit (the row-related circuit) can stably be supplied with a power supply voltage.

Where control circuit 30 receives power supply voltage Vcc1 as an operating power supply voltage, power supply control circuit 25 is provided with a level conversion function of converting, to a signal of amplitude Vcc2, a signal of amplitude Vcc1 outputted from mode detection circuit 32.

In the mode switching of transitioning from the sleep mode to the normal mode, transition to the active cycle is prohibited until elapse of a predetermined period of time after the sleep mode completes. This predetermined period of time is determined in accordance with the specification. Therefore, in transition from the sleep mode to the active cycle, virtual power supply and ground lines VCCV and GNDV can be driven sufficiently to prescribed voltage levels.

If the semiconductor device operates at a high frequency, there is a case where the active cycle and the standby cycle is rapidly be switched. If an MIS transistor having a thick gate insulation film is utilized for the power supply switch circuit, there is a possibility that virtual power supply and ground lines VCCV and GNDV cannot be driven sufficiently to prescribed voltage levels in transition from the standby cycle to the active cycle in the normal mode. Therefore, the approach shown in FIG. 14 is effective when the semiconductor device operates at a low frequency.

First Modification

Figure 16:
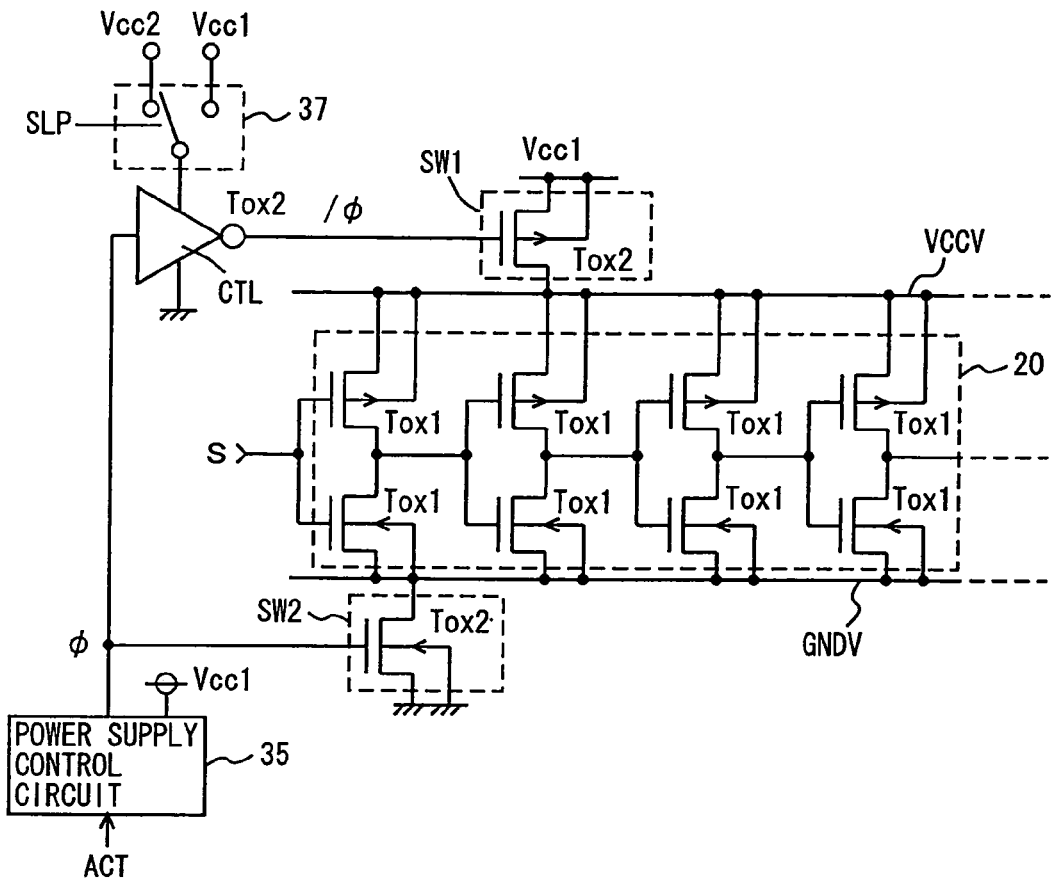
FIG. 16 shows a configuration of a modification of the fourth embodiment according to the present invention.

FIG. 16 shows a configuration of the semiconductor device in a first modification of the fourth embodiment. The semiconductor device shown in FIG. 16 differs in configuration from the semiconductor device shown in FIG. 13 in the following points. A power supply control circuit 35 generating switch control signal φ receives power supply voltage Vcc1 as an operating power supply voltage. Power supply control circuit 35 is responsive to active cycle instructing signal ACT for generating switch control signal φ changing between the voltage Vcc1 and a ground voltage. Moreover, CMOS inverter CTL generating a complementary switch control signal /φ receives, through a power supply select circuit 37, one of power supply voltages Vcc1 and Vcc2 as an operating power supply voltage. Power supply select circuit 37 is responsive to sleep mode instructing signal SLP for selecting a power supply voltage. Sleep mode instructing signal SLP is generated from mode detection circuit 32 shown in FIG. 15, and it has an amplitude Vcc2 and is held in an active state in the sleep mode. Power supply select circuit 37 selects power supply voltage Vcc2 when sleep mode instructing signal SLP instructs the sleep mode, and otherwise selects power supply voltage Vcc1.

The other configuration of the semiconductor device shown in FIG. 16 is identical to the configuration of the semiconductor device shown in FIG. 13. Accordingly, corresponding components are denoted by like reference characters and their detailed description will not be repeated.

Figure 17:
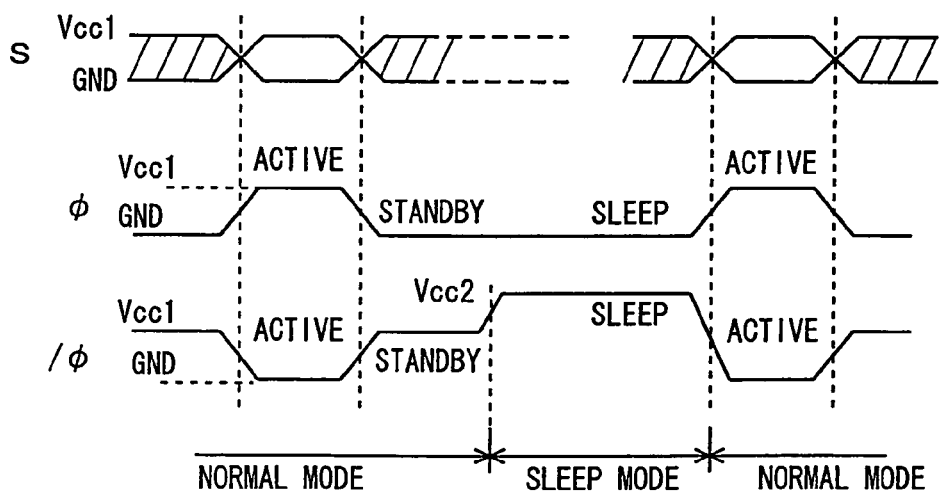
FIG. 17 is timing chart representing an operation of the semiconductor device shown in FIG. 16.

FIG. 17 is timing chart representing an operation of the FIG. 16 semiconductor device. With reference to the FIG. 17, the operation the semiconductor device shown in FIG. 16 will now be described.

The semiconductor device has a normal mode and a sleep mode as its modes of operation. The normal mode has an active cycle in which logic gate circuit 20 performs an operational processing in accordance with input signal S, and a standby cycle in which the logic gate circuit 20 waits for a subsequent processing.

When active cycle instructing signal ACT is at the L level (an inactive state), power supply control circuit 35 sets switch control signal φ to the ground voltage level. In the normal mode, sleep mode instructing signal SLP is at an inactive state of the L level and power supply select circuit 37 selects power supply voltage Vcc1 and supplies it to CMOS inverter CTL as a power supply voltage. Therefore, during the standby in the normal mode, switch control signal /φ is the level of the voltage Vcc1 and power supply switch circuits SW1 and SW2 are in a non-conductive state.

In the active cycle, power supply control circuit 35 is responsive to active cycle instructing signal ACT for driving switch control signal φ to the voltage Vcc1 level. Responsively, power supply switch circuit SW2 is rendered conductive and virtual ground line GNDV is maintained at the ground voltage level. CMOS inverter CTL outputs complementary switch control signal /φ at the ground voltage level, power supply switch circuit SW1 turns conductive, and virtual power supply line VCCV receives power supply voltage Vcc1.

In the sleep mode, active cycle instructing signal ACT is at the L level and power supply control circuit 35 sets switch control signal φ to the ground voltage level. Sleep mode instructing signal SLP is at the H level in the sleep mode, and power supply select circuit 37 selects power supply voltage Vcc2. CMOS inverter CTL receives the power supply voltage Vcc2 as an operating power supply voltage. Switch control signal φ is at the ground voltage level and complementary switch control signal /φ accordingly attains the level of power supply voltage Vcc2. Thus, power supply switch circuit SW1, in the sleep mode, enters a deeper off state, an off leak current in power supply switch circuit SW1 is reduced, and accordingly, an off leak current and gate tunnel current in logic gate circuit 20 is reduced.

Switch control signals φ and /φ have different amplitudes in the sleep mode. However, switch control signal φ is at the H level in the sleep mode and in CMOS inverter CTL, the p and n channel MIS transistors turn on and off, respectively. Therefore, CMOS inverter CTL is not particularly required to have a level conversion function. Sleep mode instructing signal SLP is a signal of amplitude Vcc2, and therefore, it is merely required to perform switching between power supply voltages Vcc1 and Vcc2 in power supply circuit 37.

Power supply select circuit 37 utilizes, as a component, an MIS transistor having a gate insulation film of thickness Tox2. With a CMOS transmission gate, power supply voltages Vcc1 and Vcc2 can be transmitted without a loss by a threshold voltage of the MIS transistor.

In the normal mode, switch control signals φ and /φ have an amplitude of Vcc1 and can rapidly change their voltage levels to switch the on/off states of power supply switch circuits SW1 and SW2 between the active cycle and the standby cycle. Therefore, even if the semiconductor device operates at high speed and the active and standby cycles are switched at high speed, virtual power supply and ground lines VCCV and GNDV can be set stably to prescribed voltage levels, respectively, and fast operation can be ensured.

In the standby cycle, MIS transistors in power supply switch circuits SW1 and SW2 simply have their source and gate voltages set to the same voltage level, and a gate leak current is slightly increased. However, by maintaining power supply switch circuit SW1 in the sleep mode to a deep off state and reducing the off leak current therein, a required low current consumption can adequately be achieved. In high speed operation, the duty of the standby cycle in the normal mode is small, and a current consumed in the standby cycle can be made sufficiently smaller in practical use, as compared with a current consumed in the active cycle. In particular, low power consumption performance is required by portable equipment and others in a data holding mode. By reducing a current consumed in the sleep mode, low power consumption feature required in practical use can adequately be met.

Second Modification

Figure 18:
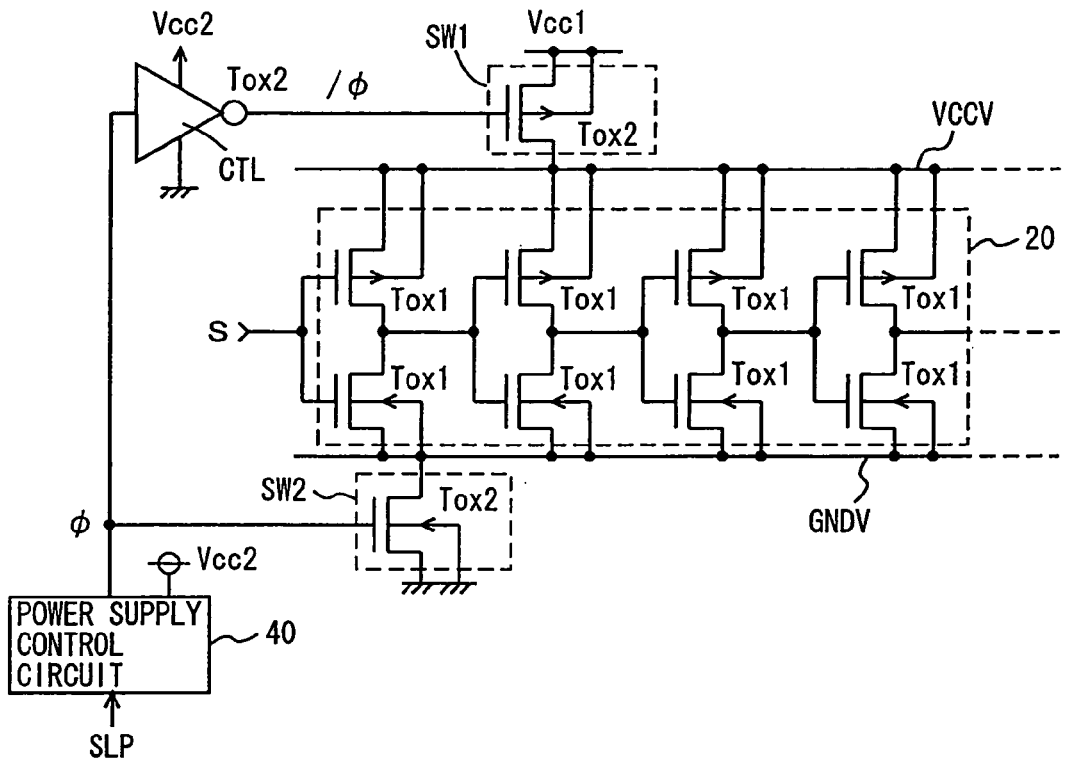
FIG. 18 shows a configuration of a second modification of the fourth embodiment according to the present invention.

FIG. 18 shows a configuration of a second modification of the fourth embodiment. The semiconductor device shown in FIG. 18 differs in configuration from the semiconductor device shown in FIG. 13 in the following points. A power supply control circuit 40 is responsive to sleep mode instructing signal SLP to generate switch control signal φ. Power supply control circuit 40 receives power supply voltage Vcc2 as an operating power supply voltage, and accordingly, switch control signal φ has an amplitude of Vcc2 as in the arrangement shown in FIG. 13. The other configuration of the semiconductor device shown in FIG. 18 is the same as the configuration of the semiconductor device shown in FIG. 13. Accordingly, corresponding components are denoted by like reference characters and their detailed description will not be repeated.

Figure 19:
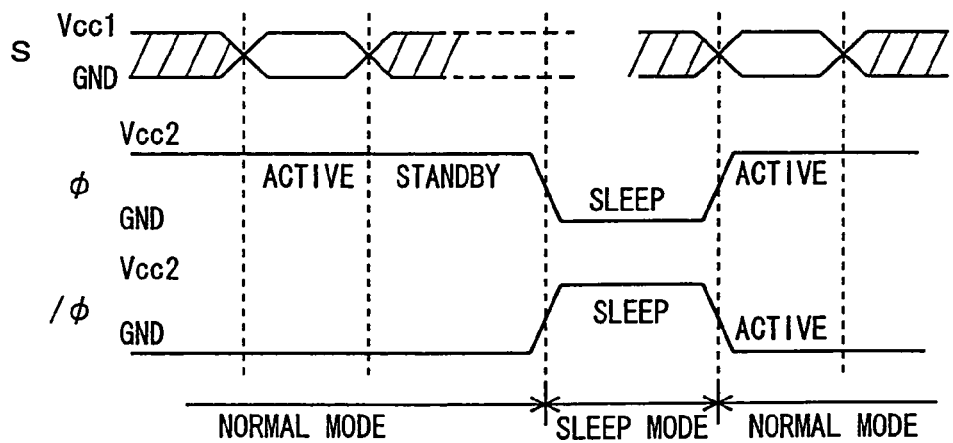
FIG. 19 is timing chart representing an operation of the semiconductor device shown in FIG. 18.

FIG. 19 is timing chart representing an operation of the semiconductor device shown in FIG. 18. With reference to FIG. 19, the operation of the semiconductor device shown in FIG. 18 will now be described.

Power supply control circuit 40 sets switch control signal φ to the level of voltage Vcc2 in the normal mode with sleep mode instructing signal being at an inactive state. Accordingly, CMOS inverter CTL outputs complementary switch control signal /φ at the ground voltage level. Responsively, power supply switch circuits SW1 and SW2 turn conductive to supply the virtual power supply and ground lines VCCV and GNDV with power supply voltage Vcc1 and the ground voltage, respectively.

Thus, in the normal mode, during both the active cycle and the standby cycle, power supply control circuit 40 sets switch control signal φ to the level of power supply voltage Vcc2 and sets power supply switch circuits SW1 and SW2 to a conductive state. Therefore, even if the semiconductor device is operated at a high frequency and the active cycle and the standby cycle are switched at high speed, the connection state between virtual power supply and ground lines VCCV and GNDV and power supply and ground nodes are invariant, so that logic circuit 20 can be operated at high speed.

In the sleep mode, power supply control circuit 40 is responsive to sleep mode instructing signal SLP to set switch control signal φ to the ground voltage level. Responsively, CMOS inverter CTL outputs complementary switch control signal /φ at the level of power supply voltage Vcc2. Accordingly, power supply switch circuit SW1 enters a deep off state and its off leak current can reliably be reduced. Correspondingly, a gate tunnel leak current and an off leak current in logic gate circuit 20 can be reduced.

Thus, power consumption in the sleep mode can be reduced, with high speed operation feature maintained.

Figure 20:
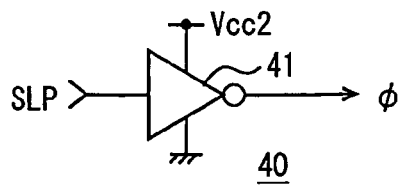
FIG. 20 shows a configuration of a portion generating a switch control signal shown in FIG. 18.

FIG. 20 shows an exemplary configuration of power supply control circuit 40 shown in FIG. 18. In FIG. 20, power supply control circuit 40 includes an inversion circuit 41 receiving sleep mode instructing signal SLP and having a level conversion function. Inversion circuit 41 with the level conversion function converts the sleep mode instructing signal SLP of amplitude Vcc1 into switch control signal φ of amplitude Vcc2. Sleep mode instructing signal SLP is applied from mode detection circuit 32 shown in FIG. 15. If sleep mode instructing signal SLP is externally, directly applied and set to the level of voltage Vcc2 when activated, inversion circuit 41 is not particularly required to have a level conversion function.

When this semiconductor device is a dynamic random access memory (DRAM), an active cycle, a standby cycle and a sleep mode correspond to an active cycle, a standby cycle and a self refresh mode, respectively. Therefore, a power down mode to suspend power supply to the circuitry not related to data retention operation in DRAM may be set in the sleep mode. In this case, the semiconductor device in the fourth embodiment corresponds to a portion of a circuit related to data retention.

If logic gate circuit 20 is a circuit related to selection of a row and related to data retention in a DRAM, when a memory cell data is refreshed, switch control signal φ needs to be set to the H level. A self refresh mode does not require fast operation. Therefore, when switch control signal φ of the level of power supply voltage Vcc2 is changed to the ground voltage level, a sufficient temporal margin can be taken, and virtual power supply and ground lines VCCV and GNDV can be set to their predetermined voltage levels. To a power supply control circuit of a row-related circuit, a control signal corresponding to a combination of sleep mode instructing signal SLP and refresh enable signal instructing refreshing execution is applied.

As described so far, according to the fourth embodiment, a power supply switch control signals of a plurality of amplitudes are prepared and in response to the state of the operation, the amplitude of switch control signals is switched. Thus, current consumption in an operation requiring low current consumption feature can be reduced reliably while maintaining high speed operation feature.

Fifth Embodiment

FIG. 21 schematically shows a general configuration of the semiconductor device according to a fifth embodiment of the present invention. In FIG. 21, the semiconductor device includes a plurality of circuit blocks LCK1 to LCKn. Circuit blocks LCK1 to LCKn may be functional blocks performing different functions, respectively. Furthermore, if a memory array is divided in a plurality of array blocks as in a semiconductor memory device, the circuit block may be a peripheral circuit block provided corresponding to each array block. The peripheral circuit block includes a row decoder and a local control circuit.

For circuit blocks LCK1 to LCKn, high-level side power source switch circuits SW11-SWn1 are provided, respectively, and low-level side power source switch circuits SW12 to SWn2 are provided, respectively. Power supply switch circuits SW11 . . . SWn1 and SW12 . . . SWn2 are each constructed of p and n channel MIS transistors each having a gate insulation film of thickness Tox2. Circuit blocks LCK1 to LCKn are each comprised of an MIS transistor having a gate insulation film of thickness Tox1.

For power supply switch circuits SW11 to SWn1, CMOS inverters LCTL1 to LCTLn are provided for generating switch control signal /φ1 to /φn, respectively. CMOS inverters LCTL1 to LCTLn receive switch control signals φ1 to φn, respectively, from power supply control circuit 50.

For CMOS inverters LCTL1 to LCTLn, power supply select circuits PVS1 to PVSn are provided, respectively. Power supply select circuits PVS1 to PVSn each select one of power supply voltages Vcc2 and Vcc1 in response to sleep mode instructing signal SLP. Power supply select circuits PVS1 to PVSn select power supply voltage Vcc2o when sleep mode instructing signal SLP is active. When sleep mode instructing signal SLP is inactive to instruct the normal mode, power supply select circuits PVS1 to PVSn select power supply voltage Vcc1. Power supply switch circuits SW11 to SWn1 are supplied with power supply voltage Vcc1. Power supply voltages Vcc1 and Vcc2 have a relationship identical to that of power supply voltages Vcc1 and Vcc2 in the semiconductor devices of the first to fourth embodiments.

Power supply control circuit 50 is responsive to mode instructing signal MOD and a circuit block designation signal BS for setting switch control signal φ for a designated circuit block to an active state (the H level). Power supply control circuit 50 receives power supply voltage Vcc1 as an operating power supply voltage, and switch control signals φ1 to φn each have an amplitude equal to power supply voltage Vcc1.

Figure 22:
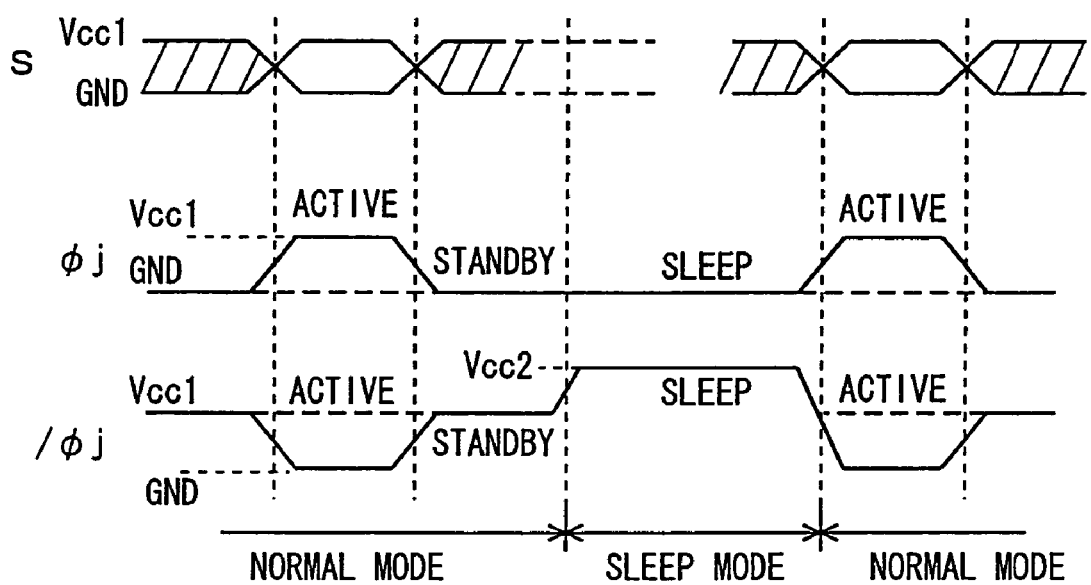
FIG. 22 is timing chart representing an operation of the semiconductor device shown in FIG. 21.

FIG. 22 is timing chart representing an operation of the semiconductor device shown in FIG. 21. With reference to FIG. 22, the operation of the semiconductor device shown in FIG. 21 will now be described. In FIG. 22, switch control signals φj and /φj for circuit block LCKj are representatively shown, where j=1 to n.

In the normal mode, sleep mode instructing signal SLP is an inactive state and power supply select circuits PVS1 to PVSn select power supply voltage Vcc1 and supply it to their respective CMOS inverters LCTL1 to LCTLn as an operating power supply voltage. In the active cycle, power supply control circuit 50 is responsive to mode instructing signal MOD and circuit block designation signal BS, to drive for a selected circuit block to an active state and to maintain switch control signal φj for a non-selected circuit block at the L level of inactive state. In FIG. 22, the state of the switch control signal for a selected circuit block is indicated by a solid line, and the state of the switch control signal for a non-selected circuit block is indicated by a broken line.

When switch control signal φj is driven to a selected state, its voltage level is the power supply voltage Vcc1 level. In the standby state, switch control signal φj is at the ground voltage GND level, and CMOS inverter LCTLj outputs switch control signal /φj at the power supply voltage Vcc1 level. Therefore, switch control signals φj and /φj in the normal mode change with a small amplitude of an amplitude Vcc1, and the corresponding circuit block LCKj is supplied with power supply voltage Vcc1 and ground voltage GND rapidly.

Even if circuit blocks LCK1 to LCKn operate at high speed and the standby cycle and the active cycle are rapidly switched, the virtual power supply line (VCCV)) and the virtual ground line (GNDV) can be maintained at a stable voltage level.

In particular, these virtual power supply and ground lines are simply arranged for a corresponding circuit block, and have a small load. Therefore, the power supply switch circuit, in transition from the standby cycle to the active cycle, can rapidly drive corresponding virtual power supply and ground lines to predetermined voltage levels.

Furthermore, an actually operating circuit is supplied with the power source voltage and a corresponding circuit block alone operates. An unselected circuit block is not supplied with a current, and a current consumption can be reduced.

When a transition is made to the sleep mode, power supply select circuits PVS1 to PVSn select, in response to sleep mode instructing signal SLP, the power supply voltage Vcc2 and supply it to their respective CMOS inverters LCTL1 to LCTLn as an operating power supply voltage. In this case, power supply control circuit 50 is responsive to the sleep mode instructing signal (included in mode instructing signal MOD) to maintain all of switch control signals φ1 to φn at the ground voltage GND level. CMOS inverters LCTL1 to LCTLn generate, without a level conversion, switch control signal /φ1 to /φn (/φj) of the level of power supply voltage Vcc2 to power supply switch circuits SW11 to SWN1, respectively.

In this sleep mode, power supply switch circuits SW11 to SWn1 enter a deep off state and their respective off leak currents are reduced. Responsively, a gate tunnel current and an off leak current at the MIS transistors of thickness Tox1 in circuit blocks LCK1 to LCKn can be reduced.

Thus, where an internal logic gate circuit is divided into circuit blocks LCK1 to LCKn, the load of each virtual power supply line and each virtual ground line can be reduced, and in transition to the active cycle, the voltage levels of the virtual power supply and ground lines for a selected circuit block can be set rapidly by the corresponding power supply switch circuits SW11 to SWn1 and SW12 to SWN2 to predetermined voltage levels. Furthermore, switch control signal φj has an amplitude of Vcc1 in the normal mode and its state can rapidly be switched in response to a mode instructing signal, and accordingly, the entire semiconductor device maintains its operation speed without degradation.

Furthermore, power supply switch circuits SW11 to SWn1 receive switch control signals /φ1 to /φn of voltage Vcc2 level, respectively, and are set to a deep off state in the sleep mode, and the respective off leak currents are reduced.

As for the configuration of power supply control circuit 50, such a construction would be sufficient that buffer circuit 26 shown in FIG. 15 is provided for each of circuit blocks LCK1 to LCKn and when active cycle instructing signal ACT is activated and a corresponding block designation signal BS is also in a selected state, a corresponding one of switch control signals 1 to φn are driven to the voltage Vcc1 level. It is sufficient to provide, for each circuit block, a gate circuit for taking a logical product of active cycle instructing signal ACT and block designation signal BS (BSj).

Due to the division into circuit blocks LCK1 to LCKn, loads of virtual power supply lines and virtual ground lines can be reduced. Where a corresponding virtual power supply and ground lines can be driven to a predetermined voltage level sufficiently even if the state of a power supply switch circuit is switched between the active cycle and the standby cycle in response to a switch control signal of an amplitude of Vcc2, power supply voltage Vcc2 may be supplied to CMOS inverters LCTL1 to LCTLn shown in FIG. 21 and switch control signals φ1 to φn may also be generated in the form of a signal of amplitude Vcc2.

As described so far, according to the fifth embodiment, an internal circuit is divided into a plurality of circuit blocks, and the power switch circuit is provided for each circuit block and only for a selected circuit block, a corresponding power supply switch circuit is set to the turn on state. Without degradation of high speed operation performance, current consumption in a mode of operation required of a low current consumption can be reduced.

Sixth Embodiment

Figure 23:
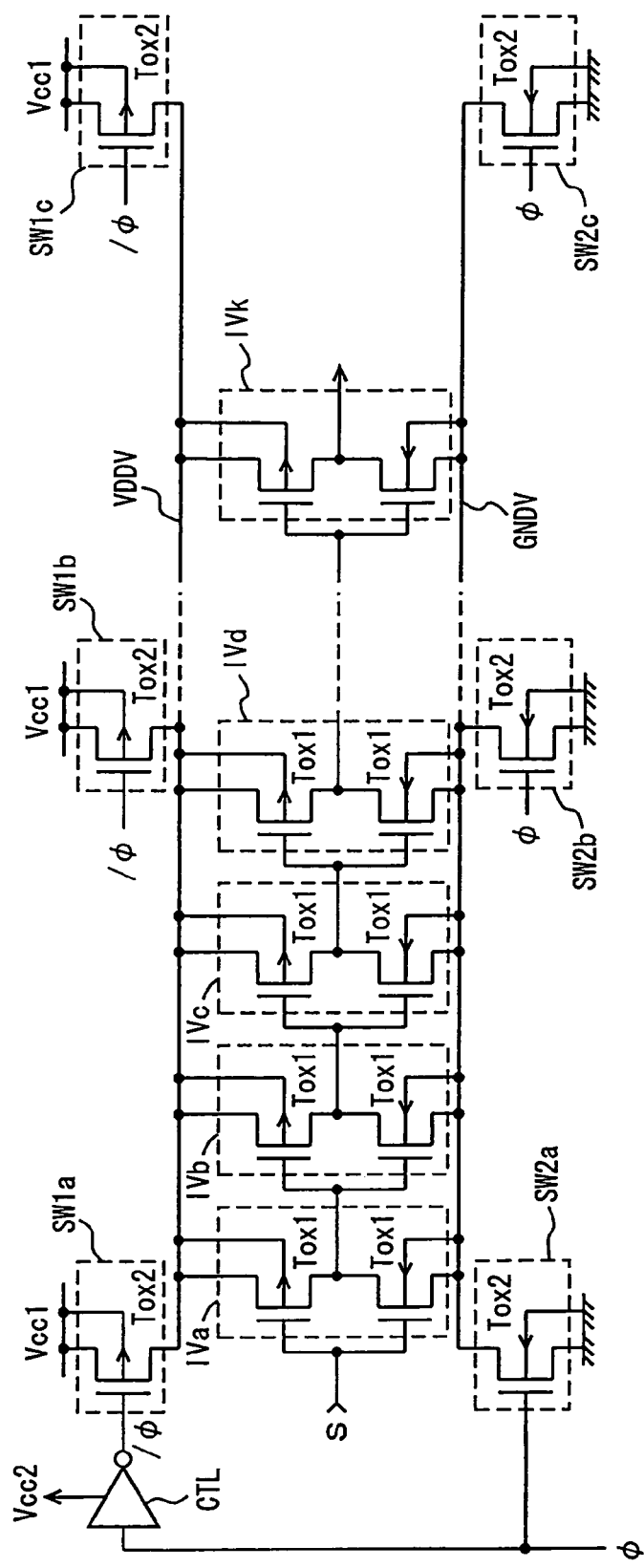
FIG. 23 shows a configuration of the semiconductor device according to a sixth embodiment of the present invention.

FIG. 23 shows a configuration of the semiconductor device according to a sixth embodiment of the present invention. In FIG. 23, the semiconductor device includes cascaded CMOS inverters IVa to IVk as a logic gate circuit. CMOS inverters IVa to IVk each include a p channel MIS transistor having a gate insulation film of thickness Tox1 and an n channel MIS transistor having a gate insulation film of thickness Tox1.

A virtual power supply line VDDV and a virtual ground line GNDV are provided commonly to CMOS inverters IVa to IVk.

For virtual power supply line VDDV, power supply switch circuits SW1a, SW1b and SW1c are provided and, for virtual ground line GNDV, power supply switch circuits SW2a, SW2b and SW2c are provided. Power supply switch circuits SW1a to SW1c are each constructed of a p channel MIS transistor selectively made conductive in response to complementary switch control signal /φ. The MIS transistors included in power supply switch circuits SW1a to SW1c each have a gate insulation film of thickness Tox2.

Power supply switch circuit SW1a and SW1c are arranged at opposite ends of virtual power supply line VDDV and power supply switch circuit SW1b arranged at a central portion of virtual power supply line VDDV. Voltage distribution on virtual power supply line Vccb can be reduced.

Power supply switch circuits SW2a to SW2c are each constructed of an n channel MIS transistor having a gate insulation film of thickness Tox2 and selectively rendered conductive in response to switch control signal φ.

Complementary switch control signal /φ is generated from CMOS inverter CTL receiving switch control signal φ. CMOS inverter CTL receives power supply voltage Vcc2 as an operating power supply voltage. Switch control signal φ has an amplitude of the voltage Vcc2.

The virtual ground line is also provided, at opposite ends, with power supply switch circuits SW2a and SW2c, respectively, and with power supply switch circuit SW2b at a central portion of the ends, to prevent voltage distribution on virtual ground line GNDV.

Figure 24:
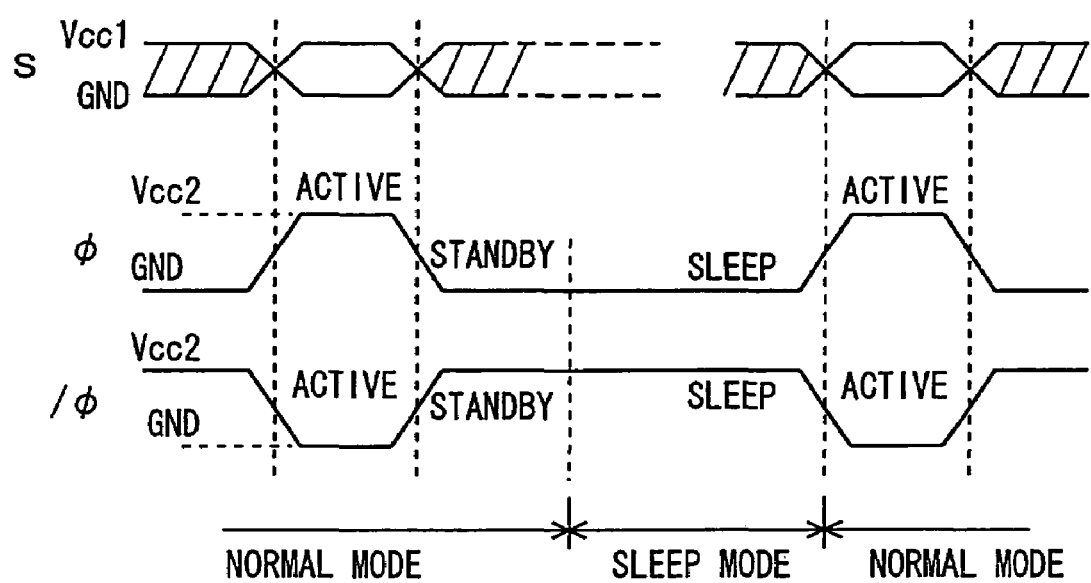
FIG. 24 is timing chart representing an operation of the semiconductor device shown in FIG. 23.

FIG. 24 is timing chart representing an operation of the semiconductor device shown in FIG. 23. With reference to FIG. 24, the operation of the semiconductor device shown in FIG. 23 will now be described.

In the active cycle, switch control signal φ is at the level of power supply voltage Vcc2 and switch control signal /φ is at the level of ground voltage GND. In this state, virtual power supply line VDDV is supplied through power supply switch circuits SW1a to SW1c with power supply voltage Vcc1. Similarly, for virtual ground line GNDV, power supply switch circuits SW2 to SW2c turn conductive to couple virtual ground line GNDV with ground node.

An effect of interconnection line resistance in virtual power supply and ground lines VDDV and GNDV and others can be eliminated, voltage distribution can be prevented from occurring on virtual power supply and ground lines VDDV and GNDV, and CMOS inverters IVb to IVk can operate stably. In addition, a plurality of power supply switch circuits SW1a to SW1c are be provided to equivalently increase the current supplying ability, and virtual power supply line VDDV can be supplied with power supply voltage Vcc1 with a large current driving ability. Furthermore, virtual ground line GNDV is also be provided with power supply switch circuits SW2a to SW2c and virtual ground line GNDV can be discharged with a large current driving ability to the ground voltage level. Accordingly, CMOS inverters IVa to IVk can be operated in response to input signal S rapidly and stably.

In the standby cycle, switch control signal φ is set to the ground voltage GND level and switch control signal /φ to the level of power supply voltage Vcc2. Accordingly, p channel MIS transistors included in power supply switch circuits SW1a to SW1c can be set to a deep off state and an off leak current can reliably be reduced in power supply switch circuits SW1a to SW1c, and responsively, a leak current (an off leak current and a gate tunnel current) in CMOS inverters IVa to IVk can be reduced.

Furthermore, even if the active cycle and the standby cycle are switched at high frequency, virtual power supply and ground lines VDDV and GNDV are driven by a plurality of power supply switch circuits SW1a to SW1c and SW2a to SW2c, respectively, and the voltage levels of virtual power supply and ground lines VCCV and GNDV, in transition to the active cycle, can rapidly be stabilized, and CMOS inverters IVa to IVk can rapidly and stably be operated.

In the sleep mode, as in the standby cycle, switch control signal φ is at the ground voltage GND level and switch control signal /φ is at the level of power supply voltage Vcc2. As in the standby cycle, power supply switch circuits SW1a to SW1c for virtual power supply line VDDV can be set to a deep off state, and an off leak current in the power supply switch circuits in the sleep mode can be reduced. Accordingly, in CMOS inverters IVa to IVk, a gate tunnel current and an off leak current can be reduced and a current consumption can be reduced.

Switch control signal φ and /φ may be generated in a manner as in any of the first to fifth embodiments.

As described so far, according to the sixth embodiment, a plurality of power supply switch circuits are provided for each of a virtual power supply line and a virtual ground line provided for a logic gate circuit. Consequently, in the virtual power supply and ground lines, a distribution of power supply and ground voltages, caused by an interconnection line resistance and others can be prevented. Furthermore, in the active cycle, the virtual power supply and ground lines each can have a voltage level maintained stably, and when a circuit operates, an operating power supply voltage can be supplied stably and generation of power supply node can be suppressed. Accordingly, an operating margin of a logic gate circuit can be maintained and the logic gate circuit can operate stably at high speed.

Furthermore, in an operation state required of a low current consumption, such as the standby cycle and the sleep mode, a power supply switch circuit is set into a deep off state. Consequently, an off leak current in a power supply switch circuit can prevented in a mode/cycle of operation required of a low current consumption and accordingly, a gate tunnel current and an off leak current in a logic gate circuit can be reduced.

Meanwhile, switch control signal φ can be generated utilizing a power supply control circuit configured as shown in FIG. 15.

Seventh Embodiment

Figure 25:
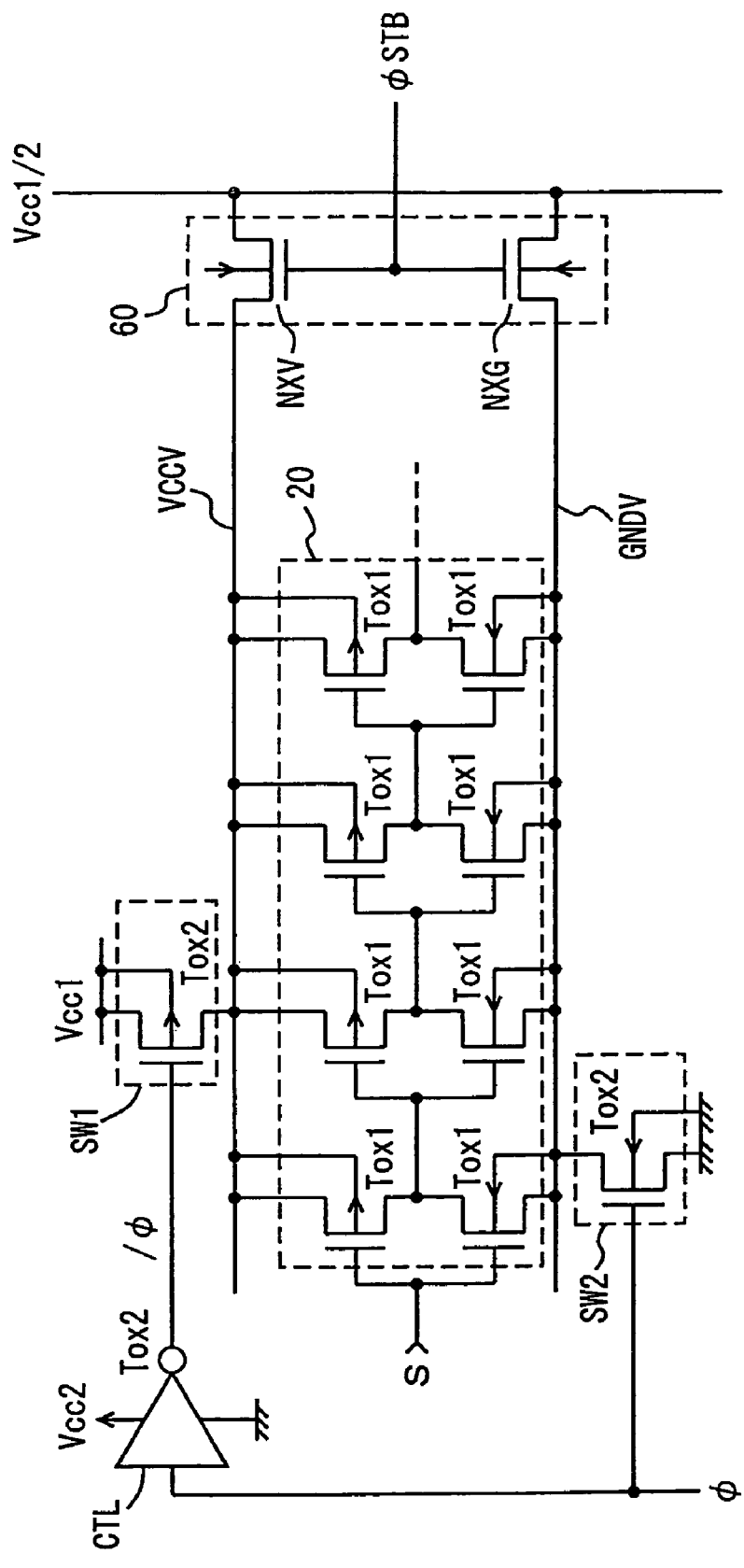
FIG. 25 shows a configuration of the semiconductor device according to a seventh embodiment of the present invention.

FIG. 25 shows a configuration of the semiconductor device according to a seventh embodiment of the present invention. The semiconductor device shown in FIG. 25 differs in configuration from the semiconductor device shown in FIG. 1 in the following points. A precharge circuit 60 is provided to precharge virtual power supply line VCCV and virtual ground line GNDV to the level of an intermediate voltage (Vcc1)/2 in the standby state. Precharge circuit 60 includes n channel MIS transistors NXV and NXG rendered conductive in response to a standby state instructing signal φSTB, to transmit intermediate voltage (Vcc1)/2 to virtual power supply and ground lines VCCV and GNDV. The other configuration of the semiconductor device shown in FIG. 25 is similar to the semiconductor device shown in FIG. 1. Accordingly, corresponding components are denoted by like reference characters and their detailed description will not be repeated.

Switch control signals φ and /φ are Vcc2 in amplitude, and standby state instructing signal φSTB is Vcc1 in amplitude.

Figure 26:
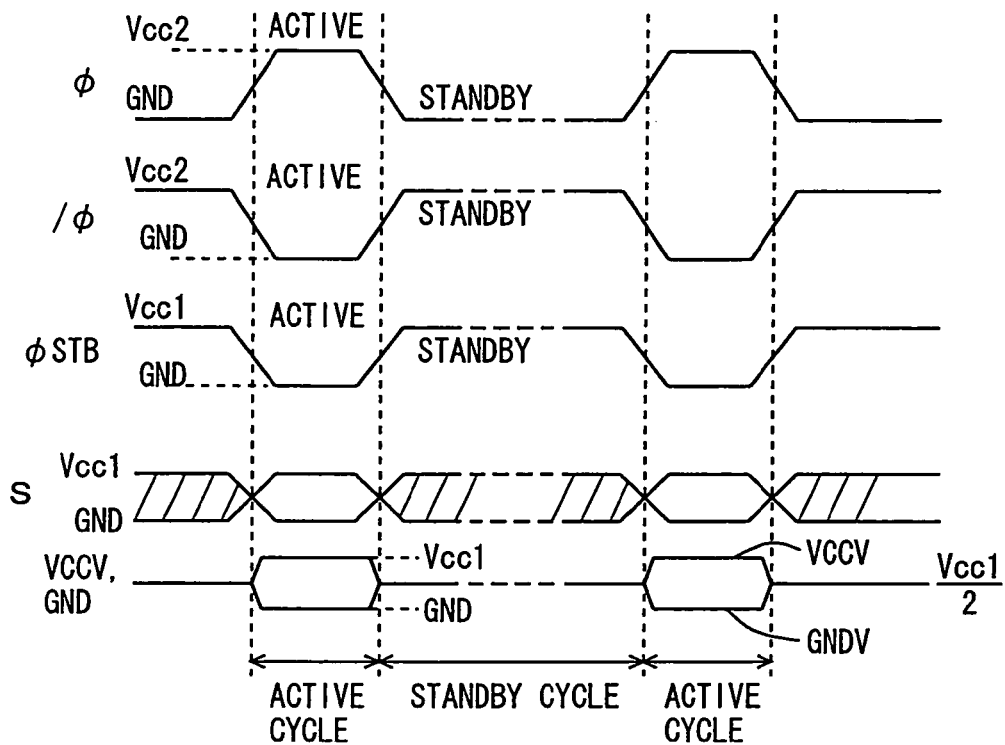
FIG. 26 is timing chart representing an operation of the semiconductor device shown in FIG. 25.

FIG. 26 is timing chart representing an operation of the semiconductor device shown in FIG. 25. With reference to FIG. 26, the operation of the semiconductor device shown in FIG. 25 will now be described.

In the standby cycle, switch control signal φ is at the ground voltage GND level and complementary switch control signal /φ is at the level of power supply voltage Vcc2. Furthermore, standby state instructing signal φSTB is at a level of power supply voltage Vcc1. In this state, power supply switch circuits SW1 and SW2 are in an off state.

In precharge circuit 60, its internal MIS transistors NXV and NXG are in a conductive state in accordance with standby state instructing signal φSTB, to transmit intermediate voltage (Vcc1)/2 to virtual power supply and ground lines VCCV and GNDV. Accordingly, in the standby cycle, virtual power supply and ground lines VCCV and GNDV is maintained at the level of intermediate voltage (Vcc1)/2.

When the active cycle starts, standby state instructing signal φSTB attains the ground voltage GND level. In precharge circuit 60, MIS transistors NXV and NXG turn off and an operation of precharging virtual power supply and ground lines VCCV and GNDV to the intermediate voltage level is terminated.

Furthermore, switch control signal φ is driven to the level of power supply voltage Vcc2 and complementary switch control signal /φ to the ground voltage GND level. Virtual power supply line VCCV is driven by power supply switch circuit SW1 to the level of power supply potential Vcc1 and virtual ground line GNDV is driven via power supply switch circuit SW2 to the ground voltage GND level.

If input signal S to logic gate circuit 20 changes in the active cycle, virtual power supply and ground lines VCCV and GNDV are simply driven from intermediate voltage (Vcc1)/2 to power supply voltage VCC and the ground voltage GND level, respectively, and virtual power supply and ground lines VCCV and GNDV can have a voltage level made definite substantially at a fixed timing. More specifically, if precharge circuit 60 is not provided, virtual power supply and ground lines VCCV and GNDV have their voltage levels determined by the amount of the leak current in logic gate circuit 20. This leak current depends on a gate insulation film thickness of and a threshold voltage of a MIS transistor constructing logic gate circuit 20. The gate insulation film thickness and the threshold voltage vary for each semiconductor device within a certain range. Consequently, virtual power supply and ground lines VCCV and GNDV, when the active cycle starts, have their voltage levels different for each semiconductor device, and a worst case needs to be considered in determining a circuit operation margin. Therefore, high speed operation cannot be ensured.

However, as shown in FIG. 25, when virtual power supply and ground lines VCCD and GNDV are fixed, in the standby state, to a predetermined voltage level with precharge circuit 60, virtual power supply and ground lines VCCV and GNDV, when the active cycle starts, have their voltage levels fixed to the precharged voltage level of intermediate voltage (Vcc1)/2, regardless of the leak current in the logic gate circuit 20. Consequently, in each semiconductor device, virtual power supply and ground lines VCCV and GNDV can have their starting voltage levels fixed when the active cycle starts, voltages of virtual power supply and ground line VCCV can be made definite at a fixed timing, an operating margin can be improved, and high speed operation can be ensured. In particular, such a state can be prevented from occurring in a sleep mode or others that a standby state is maintained over a long period of time and the voltage level of the virtual power supply line VCCV is deviated significantly from the power supply voltage Vcc1 and a long time is required to restore to the original power supply voltage level to impede the high speed operation.

Furthermore, since virtual power supply and ground lines VCCV and GNDV are set to an intermediate voltage level, the gate to source voltage of an MIS transistor in the on state in logic gate circuit 20 can be reduced in absolute value to reduce the gate tunnel current in the MIS transistor in the on state. Furthermore, an MIS transistor in the off state can have the gate to source voltage set to deeply reverse-biased state, and an off leak current of an MIS transistor in a logic gate can be reduced.

In precharge circuit 60, gate insulation film of MIS transistors NXV and NXG can be any thickness of Tox1 and Tox2, provided that their substrate regions are isolated from the other elements and their backgates are in a floating state.

Furthermore, even if MIS transistors NXV and NXG each have a threshold voltage set to 0.5V, intermediate voltage (Vcc1)/2 can be fully transmitted provided that power supply voltage Vcc1 is at a level of 1.0V and standby state instructing signal φSTB has the H level set at a level of power supply voltage Vcc2. In this case, even if standby state instructing signal φSTB has the H level set at a level of the voltage Vcc1, MIS transistors NXG and NXV each have the gate to source voltage set at a level of its threshold voltage, and intermediate voltage (Vcc1)/2 can be transmitted. However, these precharging transistors have their gate insulation films set to Tox2 in thickness, to reduce a gate tunnel current.

Figure 27:
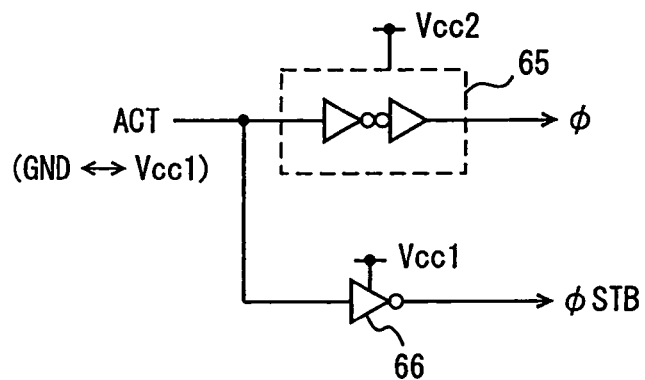
FIG. 27 shows an example of a configuration generating a control signal shown in FIG. 25.

FIG. 27 shows an exemplary configuration of a power supply control signal generating portion for generating switch control signal ϕ and standby state instructing signal ϕSTB shown in FIG. 25. In FIG. 27, the power supply control signal generation portion includes a buffer circuit 65 having a level conversion function of converting an amplitude of active cycle instructing signal ACT of amplitude Vcc1 to generate switch control signal ϕ of amplitude Vcc2, and an inversion circuit 66 for inverting active cycle instructing signal ACT to generate standby state instructing signal ϕSTB. Inversion circuit 66 receives power supply voltage Vcc1 as an operating power supply voltage.

Active cycle instructing signal ACT is generated, for example, by the mode detection circuit shown in FIG. 15, and is activated when the present semiconductor device is set to an operating state. Active cycle instructing signal ACT is an array activation signal (a row select instructing signal) for driving a memory cell array to a selected state in a DRAM and corresponds to a chip enable signal in a static random access memory (SRAM).

The power supply control signal generating portion shown in FIG. 27 allows switch control signal ϕ and standby state instructing signal ϕSTB different in amplitude from each other to be generated based on the common active cycle instructing signal ACT.

In the configuration of the power supply control signal generating portion shown in FIG. 27, in the sleep mode, active cycle instructing signal ACT attains an inactive state of the L level, and accordingly, standby state instructing signal ϕSTB attains an active state of the H level. Consequently, during the sleep mode, virtual power supply and ground line VCCD and GNDV are precharged to the level of intermediate voltage (Vcc1)/2.

However, if virtual power supply and ground lines VDDV and GNDV are small in duty of the standby cycle and are sufficiently small in voltage variation in this semiconductor device, or if upon transition from the standby cycle to the active cycle in a high speed operation, virtual power supply and ground lines VCCV and GNDV have a voltage level change not made fast enough, then precharge circuit 60 shown in FIG. 25 may be configured to be activated only in the sleep mode to precharge virtual power supply and ground lines VDDV and GNDV to the intermediate voltage level. In such a case, standby state instructing signal ϕSTB is generated simply in accordance with the sleep mode instructing signal.

As described so far, according to the seventh embodiment, when the semiconductor device is in an operation suspended state, the virtual power supply line and the virtual ground line are precharged to predetermined voltage levels. Consequently, when the semiconductor device is released from operation suspended state, the virtual power supply and ground lines can have reduced voltage variation, a power supply voltage and a ground voltage can be set, at a faster timing, to a definite state, a circuit operating margin can sufficiently be ensured, and a circuit operation can be stabilized.

Furthermore, if this precharge voltage is set to a voltage level intermediate between the power supply voltage and the ground voltage, gate to source voltage of an MIS transistor in the on state can be reduced, a gate tunnel current can effectively be reduced, and accordingly, a current consumed in an operation suspended state such as the standby cycle can be reduced.

The configuration utilizing precharge circuit 60 can be combined with any of the configurations of the first to sixth embodiments.

Eighth Embodiment

Figure 28:
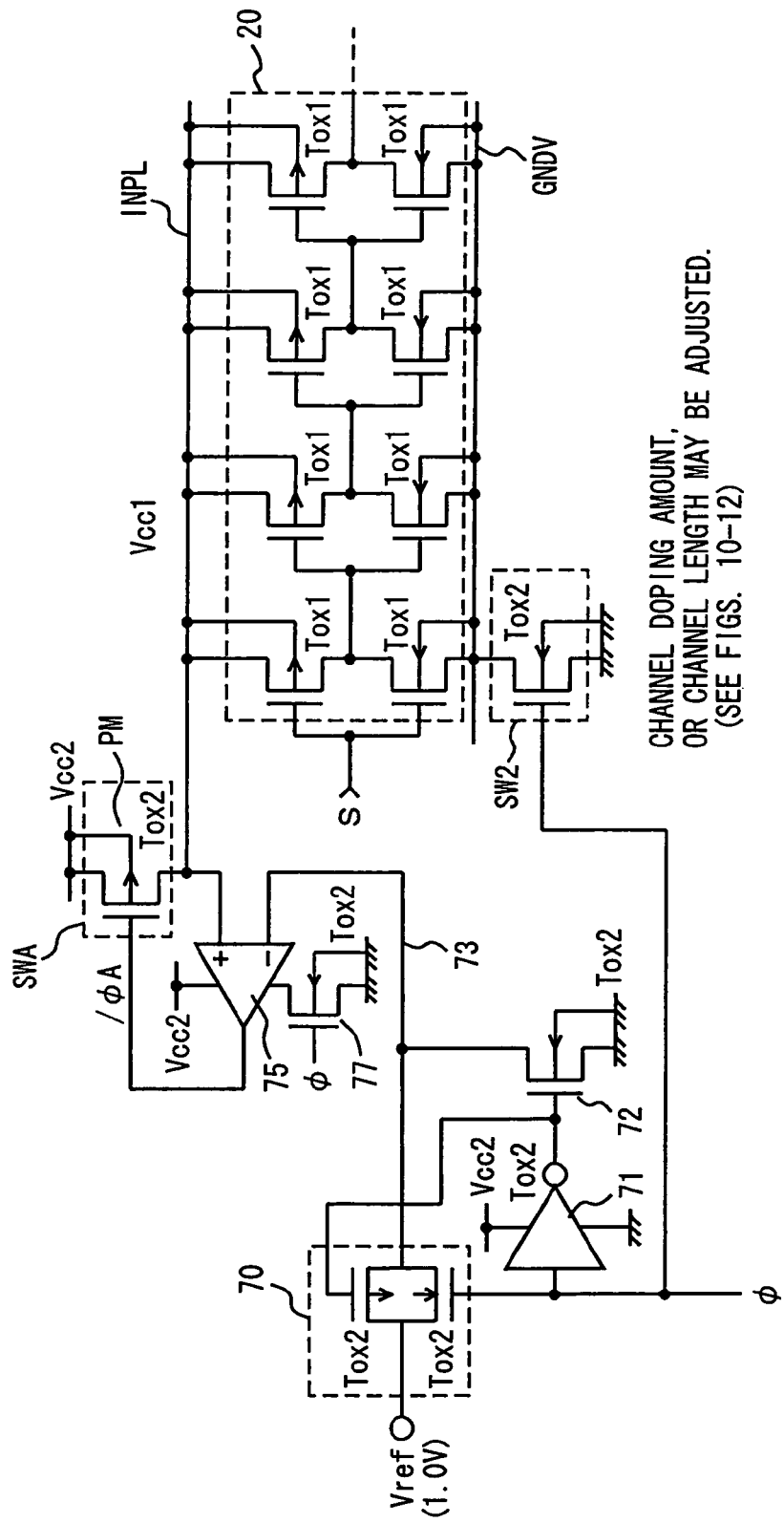
FIG. 28 shows a configuration of the semiconductor device according to an eighth embodiment of the present invention.

FIG. 28 shows a configuration of the semiconductor device according to an eighth embodiment of the present invention. In FIG. 28, the semiconductor device includes a logic gate circuit 20 including a plurality of cascaded inverters. Logic gate circuit 20 includes an MIS transistor having a gate insulation film of thickness Tox1 and performs a predetermined processing (delay and/or inversion in the present embodiment) in accordance with input signal S.

For logic gate circuit 20, an internal power supply line INPL and a virtual ground line GNDV are arranged. Internal power supply line INPL is connected commonly to sources of p channel MIS transistors in CMOS inverters included in logic gate circuit 20, and virtual ground line GNDV is connected commonly to sources of n channel MIS transistors in logic gate circuit 20.

Virtual ground line GNDV is provided with power supply switch circuit SW2 rendered conductive in response to switch control signal ϕ. Power supply switch circuit SW2 is constructed of an n channel MIS transistor having a gate insulation film of thickness Tox2. Logic gate circuit 20 and power supply switch circuit SW2 are similar in configuration to those in the first to seventh embodiments.

Internal power supply line INPL is provided with a comparison circuit 75 for comparing a voltage on a node 73 and a voltage on internal power supply line INPL to generate a control signal /ϕA, an n channel MIS transistor 77 rendered conductive in accordance with control signal /ϕA, for activating the comparison circuit 75, and a power drive circuit SWA for supplying a current from a power supply node receiving the power supply voltage Vcc2 to internal power supply line INPL. Comparison circuit 75 and enabling transistor 77 are each comprised of an MIS transistor having a gate insulation film of thickness Tox2. Comparison circuit 75 receives power supply voltage Vcc2 as an operating power supply voltage.

Power supply drive circuit SWA is constructed of a p channel MIS transistor PM having a gate insulation film of thickness Tox2. MIS transistor PM is connected between a power supply node supplying power supply voltage Vcc2 and internal power supply line INPL and has a gate receiving power supply drive control signal /ϕA from comparison circuit 75.

Comparison circuit 75 receives a voltage on node 73 at a negative input and a voltage on internal power supply line INPL at a positive input and differentially amplifies the voltage on node 73 and the voltage on internal power supply line INPL when enabled. Comparison circuit 75 may output the signal /ϕA changing digitally between power supply voltage Vcc2 and ground voltage GND, or may output the signal /ϕA changing in analog manner in accordance with a difference between the voltage on internal power supply line INPL and the voltage on node 73.

To set a voltage level on node 73 in accordance with a mode of operation, there are provided an inverter 71 receiving a switch control signal ϕ, a CMOS transmission gate 70 rendered selectively conductive in response to switch control signal ϕ and a signal outputted from inverter 71, to transmit a reference voltage Vref to node 73, and an n channel MIS transistor 72 rendered selectively conductive in response to a signal outputted from inverter 71, to maintain node 73 at a ground voltage level. CMOS transmission gate 70 and inverter 71 are each constructed of p and n channel MIS transistors each having a gate insulation film of thickness Tox2. MIS transistor 72 has a gate insulation film of thickness Tox2.

Inverter 71 receives power supply voltage Vcc2 as an operating power supply voltage. Switch control signal φ has an amplitude of Vcc2. However, switch control signal φ may change between power supply voltage Vcc2 and a negative voltage.

In the semiconductor device shown in FIG. 28, the MIS transistor having the gate insulation film of thickness Tox1 has a threshold voltage of 0.2V in absolute value and the MIS transistor having the gate insulation film of thickness Tox2 has a threshold voltage of 0.5V in absolute value.

Reference voltage Vref is 1.0V and power supply voltage Vcc2 is 2.5V. Thickness Tox1 and Tox2 are, for example, 2 nm and 5.5 nm, respectively.

Figure 29:
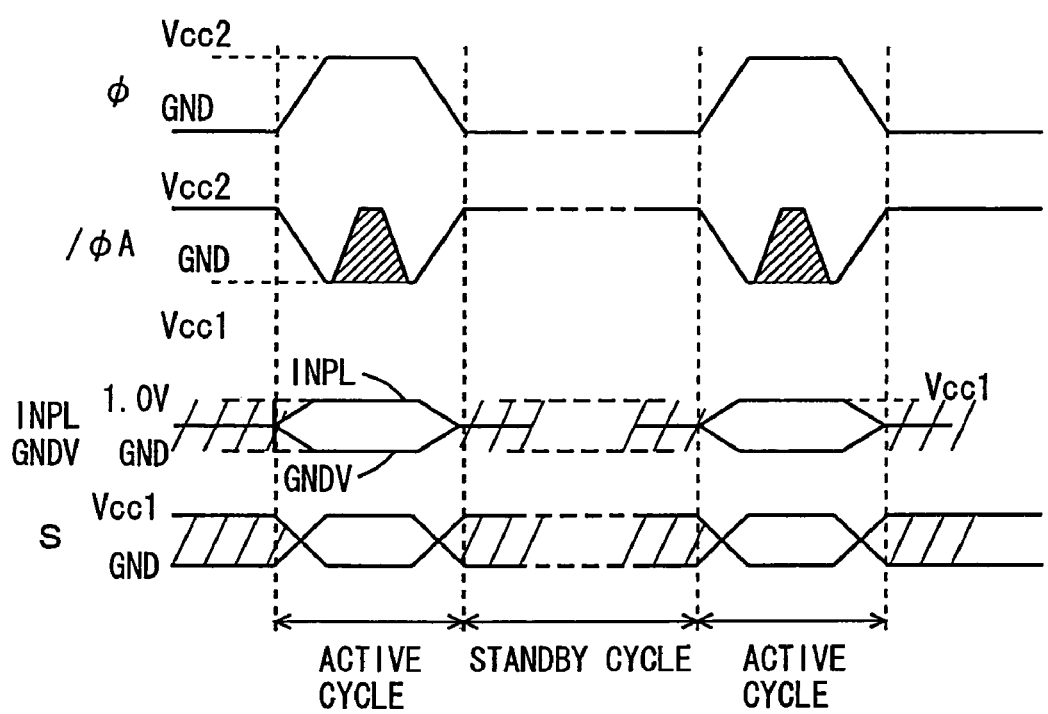
FIG. 29 is timing chart representing an operation of the semiconductor device shown in FIG. 28.
Figure 30A:
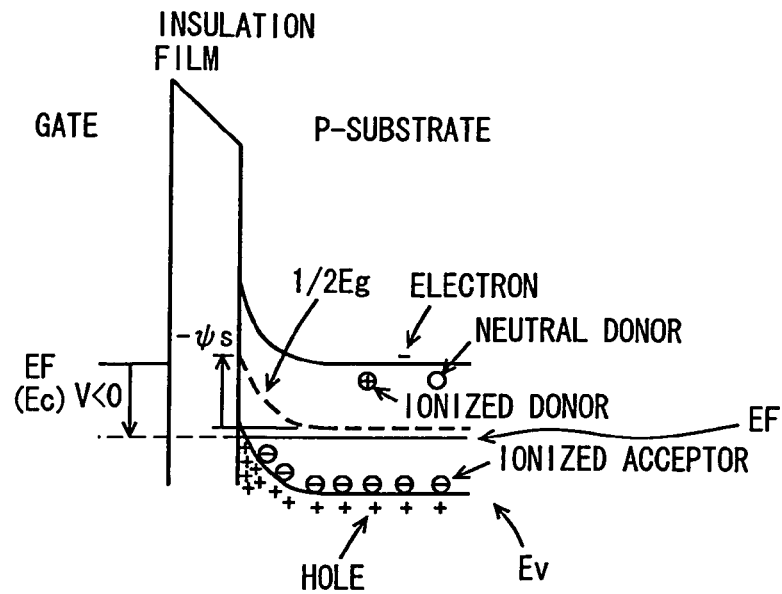
FIGS. 30A to 30C illustrate an energy band of an MIS capacitor.
Figure 30B:
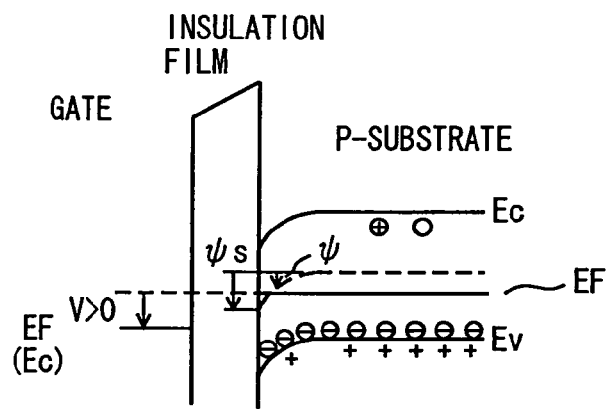
Figure 30C:
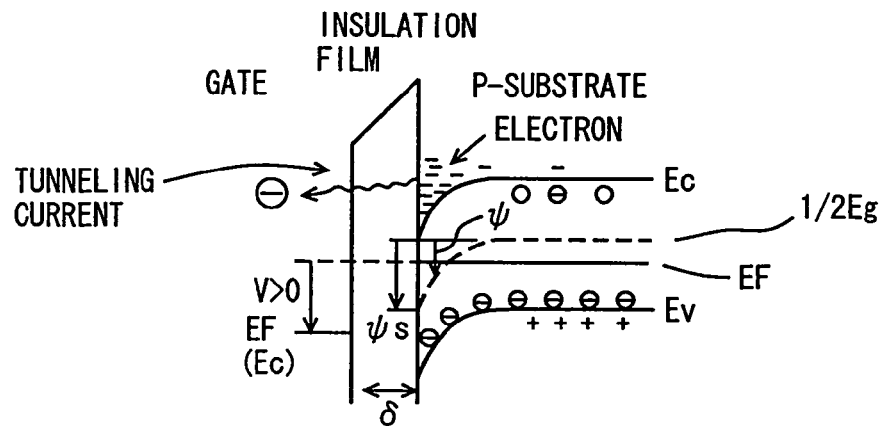
Figure 31:
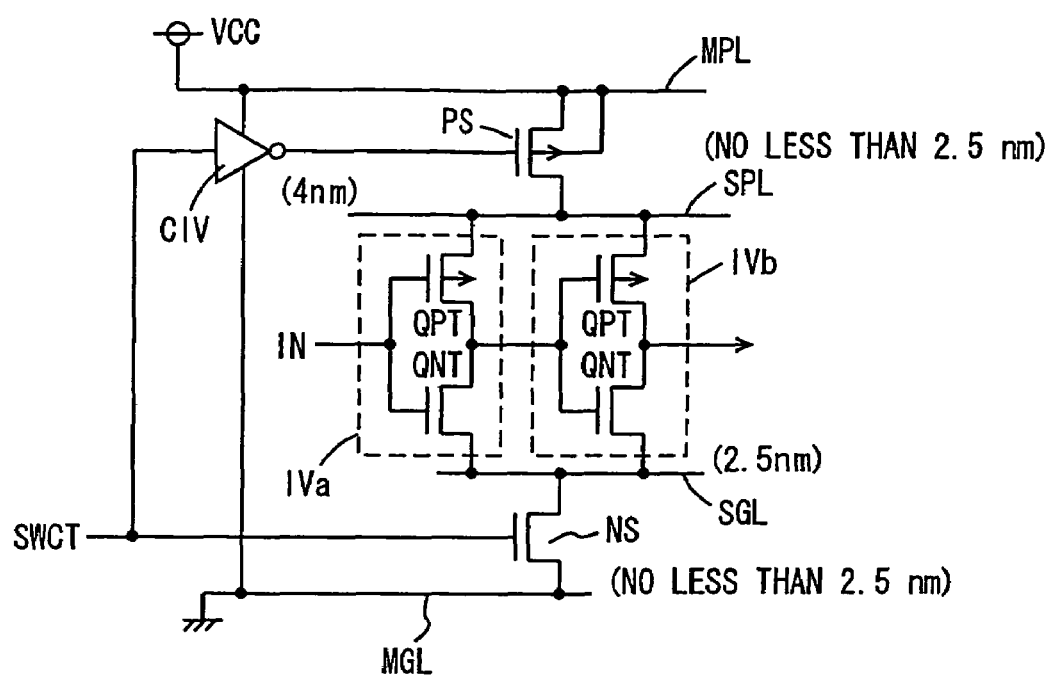
FIG. 31 shows a configuration of a conventional semiconductor device.

FIG. 29 is timing chart representing an operation of the FIG. 28 semiconductor device. With reference to FIG. 29, the operation of the semiconductor device shown in FIG. 28 will now be described.

In the standby cycle, switch control signal φ is at the ground voltage GND level. Therefore, CMOS transmission gate 70 is non-conductive, while MIS transistor 72 is conductive, and node 73 is maintained at the ground voltage GND level. For comparison circuit 75, enabling transistor 77 is turned off and the output signal /φA is maintained at the voltage level of power supply voltage Vcc2. In power supply drive circuit SWA, MIS transistor PM is in a non-conductive state.

Such configuration that comparison circuit 75 outputs, when enabling transistor 77 is in the off state, a signal of the level of power supply voltage Vcc2 can be achieved as follows. Comparison circuit 77 is constructed of a current mirror type differential amplification circuit with the current mirror stage coupled with the power supply node. Alternatively, a differential amplification circuit is provided, at an output portion thereof, with a p channel transistor rendered conductive in response to switch control signal φ, to pull up the output portion to the power supply voltage level.

In power supply switch circuit SW2 also, the n channel MIS transistor turns off in response to switch control signal φ, and virtual ground line GNDV is disconnected from the ground node. Internal power supply line INPL and virtual ground line GNDV are maintained at a voltage level according to a leak current in logic gate circuit 20. In the standby cycle, input signal S can be at any logic level.

When the active cycle starts, switch control signal φ is driven to the level of power supply voltage Vcc2. Responsively, the MIS transistor in power supply switch circuit SW2 turns conductive, virtual ground line GNDV is coupled with the ground node, and its voltage level is maintained at ground voltage GND.

CMOS transmission gate 70 is made conductive and MIS transistor 72 is non-conductive, and node 73 receives reference voltage Vref through CMOS transmission gate 70. Enabling transistor 77 turns conductive and comparison circuit 75 has its comparison operation enabled, to compare voltage Vcc1 on internal power supply line INPL and reference voltage Vref on node 73 and generates current drive control signal /φA based on a result of comparison. When voltage Vcc1 on internal power supply line INPL is higher than reference voltage Vref, comparison circuit 75 outputs a signal of the H level, MIS transistor PM in current drive control circuit SWA has a conductance reduced, and internal power supply line INPL is supplied with a reduced amount of current. When voltage Vcc1 is lower than reference voltage Vref, comparison circuit 75 outputs a signal of the L level, MIS transistor PM has the conductance increased, internal power supply line INPL is supplied with an increased current, and voltage Vcc1 increases in voltage level.

Comparison circuit 75 outputs signal /φA at a voltage level determined in accordance with a difference between voltage Vcc1 and reference voltage Vref, and the voltage on internal power supply line INPL attains 1.0V equal to reference voltage Vref when stabilized. Power supply drive circuit SWA supplies internal power supply line INPL with a current and logic gate circuit 20 operates stably.

A power supply circuit formed of a feed back loop by MIS transistor PM and comparison circuit 75, is used as an internal voltage-down conversion circuit for down-converting power supply voltage Vcc2 to generate internal power supply voltage Vcc1. Through the use of voltage-down conversion circuit for a circuit driving the virtual power supply internal power supply voltage Vcc1 at a desired, optimal voltage level can be generated from power supply voltage Vcc2.

In the case of using this internal voltage-down conversion circuit also, the current driving MIS transistor PM has a gate insulation film as thick as Tox2 to prevent generation of a gate tunnel current, and can also be operated as a leak current cutting transistor for logic gate circuit 20.

In the eighth embodiment, as in the third embodiment, the MIS transistors in the current switch circuit and logic gate circuit 20 may have the threshold voltages adjusted through adjustment of channel doping amount and/or the gate length appropriately.

The current drive transistors in current switch circuit SWA and SW2 and MIS transistor in the logic gate circuit have their channel regions doped with impurities to adjust their threshold voltages. If an amount of the impurity implanted into the impurity region, i.e., a channel doping amount is the same, thicker a gate insulation film is, larger a threshold voltage is in absolute value. Therefore, p channel MIS transistor PM is greater in absolute value of threshold value than the p channel MIS transistor of logic gate circuit 20, and the n channel MIS transistor of current switch circuit SW2 becomes higher in threshold voltage than that of logic gate circuit 20. These MIS transistors in current switch circuits each have a threshold voltage in an absolute value, for example, of 0.5V, and p and n channel MIS transistors in logic gate circuit 20 each have a threshold voltage in absolute value, for example, of 0.2V.

An amount of dopant doped into the channel region of the MIS transistor of the power supply switch circuit is made equal to the channel doping amount of the MIS transistor (PT, NT) of the same conductivity in the logic gate circuit, and a gate insulation film of the MIS transistor in the power supply switch circuit is made thicker than that of the MIS transistor of the logic gate circuit. Therefore, the threshold voltage of the MIS transistor of the power supply switch circuit can readily be made higher in absolute value than the threshold voltage of the MIS transistor in the logic gate circuit, and a leak current (a subthreshold current and a gate tunnel current) in the standby state can be reduced without complicating the fabrication process.

In adjusting a channel length, p channel MIS transistor PM in power supply switch circuit SWA has its channel length made longer than a maximal value of the channel lengths of p channel MIS transistors included in logic gate circuit 20. Furthermore, the n channel MIS transistor in power supply switch circuit SW2 has its channel length made longer than a maximal value of channel lengths of n channel MIS transistors in logic gate circuit 20. When a threshold voltage is increased in absolute value, a leak current in an off state, or a subthreshold current, can be reduced. Therefore, simply by changing a channel length, an off leak current in power supply switch circuits SW1 and SW2 can be reduced without complicating the fabrication process, and accordingly a leak current (a gate tunnel current and a subthreshold current) of the logic circuit can be reduced and thus, a current consumption in the standby state can be reduced.

As an alternative for adjusting an amount of dopant doped into a channel region, the channel doping amount of p channel MIS transistor PM in power supply switch circuit SWA is made different from that of the p channel MIS transistor included in logic gate circuit. In this case, current driving transistor PM has its threshold voltage set larger in absolute value than the MIS transistor of logic gate circuit 20. A channel doping amount of the n channel MIS transistor in power supply switch circuit SW2 is made different from that of the n channel MIS transistor in logic gate circuit 20. In this case also, the n channel MIS transistor of power supply switch circuit SW2 has its threshold voltage set larger in absolute value than n channel MIS transistor NT of logic gate circuit 20. The channel doping amount is made different between the MIS transistors in power supply switch circuits SWA and SW2 and the p and n channel MIS transistors in logic gate circuit 20 simply. An off leak current and hence a current consumed in the standby state can be reduced without complicating a fabrication process.

Power supply voltage Vcc2 may be an externally applied power supply voltage, or may be a down-converted power supply voltage generated by internally down-converting an external power supply voltage.

For internal power supply line INPL, an n channel MIS transistor having its conductance controlled by a signal outputted from a comparison circuit performing a comparison operation complementary to that of comparison circuit 75 may be provided as a current driving transistor. In other words, p and n channel MIS transistors are provided for internal power supply line INPL as a current driving transistor, to reinforce a power supply. In such arrangement, an n channel MIS transistor having a gate insulation film of thickness Tox2 can be employed solely as the current driving transistor.

Furthermore, switch control signal φ may have its logic level switched between the normal mode and the sleep mode or the power down mode (including a deep power down mode), as described in the sixth embodiment, not between the active cycle and the standby cycle. Furthermore, if the semiconductor device is a DRAM, switch control signal φ may have its state switched between a normal mode and a self refresh mode. If the semiconductor device is a circuit related to data retention, switch control signal φ is set, when a data holding operation (a refresh operation) is actually performed, to an active state to supply the virtual power supply and ground lines with a current.

For internal power supply line INPL, power supply voltage Vcc2 is down-converted to generate internal power supply voltage Vcc1. However, as for virtual ground line GNDV, a comparison circuit for comparing a reference voltage and the voltage on virtual ground line GNDV may be provided for switch circuit SW2. In this case, the virtual ground line GNDV may have the voltage level set higher than the ground voltage GND, to implement a so-called "boosted ground line", or such an internal power supply circuit may be implemented that sets virtual ground line GNDV at the ground voltage level utilizing a negative voltage VBB.

Furthermore, for internal function circuit 20, a plurality of current drive circuits may be arranged as well as and a plurality of current switch circuits SW2s may be arranged. Moreover, internal function circuit 20 may be divided into a plurality of circuit blocks, for which internal power supply line INPL is divided to be arranged correspondingly.

As described so far, in the eighth embodiment, an operation power supply line is disconnected from a power supply node while operation is suspended, and in operation, the voltage level of the power supply line is set based on a comparison between another power supply voltage and a reference voltage. The voltage on the power supply line can be more stabilized and the internal function circuit can operate stably.

In the first to eighth embodiments, a configuration of a semiconductor device is individually described, however, the first to eighth embodiments may individually and separately be applied to a semiconductor device, or may be used in an appropriate combination as described previously.

The present invention is applicable to any semiconductor devices that have an active cycle of performing a predetermined operational processing on a received signal/data, and a standby state (a standby cycle or a sleep mode or a power down mode) of stopping the processing.

Furthermore, it is not particularly required to arrange the power source switch circuit or the current driving transistor for both virtual power supply and ground lines. Even with current control on one of virtual power supply and ground lines, a leak current in the standby state can be reduced as well, while stabilizing an operating current in the active cycle.

As described above, according to the present invention, for a virtual operation power source line including a virtual power supply line and a virtual ground line, a transistor having a thick gate insulation film is used and its on/off state is adjusted in accordance with a mode of operation to control a connection between the virtual operation power source line and a corresponding power supply node. Thus, an operating power source voltage of an internal function circuit in operation can be stabilized and a leak current in stopping of operation can reliably be reduced. A semiconductor device with reduced current consumption and a stable and high speed operation can be implemented.

In particular, even if an MIS transistor in an internal logic gate circuit has a gate insulation film made as thin as no more than 2 nm, the logic gate circuit can be operated stably while reducing the leak current. Thus, a semiconductor device constructed of ultra-microfabricated transistors and operating stably with a reduced current consumption under a low power supply voltage can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a logic gate constructed of an insulated gate field effect transistor having a first gate insulation film, and receiving a voltage of an internal power node as an operating power source voltage to operate, for processing a signal of a first amplitude;

a first switching transistor connected between said internal power node and a first power source node, having a second gate insulation film greater in thickness than said first gate insulation film, and responsive to a switch control signal of a second amplitude larger than said first amplitude to be selectively made conductive for electrically coupling said first power source node and said internal power node; and a second switching transistor different in conductivity from said first switching transistor, connected between said internal power node and said first power source node, having a gate insulation film the same in thickness as said second gate insulation film thickness, and rendered selectively conductive in a common phase with said first switching transistor in response to said switch control signal.

2. The semiconductor device according to claim 1, wherein said first power source node is supplied with a voltage of a logically high level, and said first switching transistor is an n channel transistor.

3. The semiconductor device according to claim 1, wherein said first gate insulation film is no more than 2.5 nm in thickness, and said second gate insulation film is no less than 3 nm in thickness.

4. The semiconductor device according to 1, wherein said first power source node receives an externally applied first power supply voltage, and said switch control signal is generated in accordance with a mode of operation of said logic gate by a circuit receiving an externally applied second power supply voltage as an operating power supply voltage.

5. The semiconductor device according to 1, further comprising:

an internal power supply circuit for down-converting an externally applied power supply voltage to produce and supply a down-converted voltage to said first power node, wherein said switch control signal is generated in accordance with a mode of operation of said logic gate on the basis of said externally applied power supply voltage.

6. The semiconductor device according to 1, further comprising:

a power supply control circuit receiving, as an operating power supply voltage, a voltage generated through boosting of an externally supplied voltage, said power supply control circuit generating said switch control signal in accordance with a mode of operation of said logic gate.

7. The semiconductor device according to 1, wherein said switch control signal has a logically low level corresponding to a negative voltage level lower than a ground voltage.

* * * * *